(12) United States Patent
Park et al.

(10) Patent No.: US 11,282,905 B2
(45) Date of Patent: Mar. 22, 2022

(54) ELECTROLUMINESCENT DISPLAY DEVICE

(71) Applicant: LG Display Co., Ltd., Seoul (KR)

(72) Inventors: SungSoo Park, Paju-si (KR); HeeJin Kim, Paju-si (KR); HakMin Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/202,451

(22) Filed: Nov. 28, 2018

(65) Prior Publication Data

US 2019/0165068 A1    May 30, 2019

(30) Foreign Application Priority Data

Nov. 30, 2017  (KR) .................. 10-2017-0162461

(51) Int. Cl.
*H01L 29/08* (2006.01)
*H01L 51/00* (2006.01)
(Continued)

(52) U.S. Cl.
CPC ...... *H01L 27/3246* (2013.01); *H01L 27/3272* (2013.01); *H01L 51/5228* (2013.01);
(Continued)

(58) Field of Classification Search
CPC ............... H01L 27/3246; H01L 27/322; H01L 27/3272; H01L 51/5228; H01L 51/5284;
(Continued)

(56) References Cited

U.S. PATENT DOCUMENTS

| | | |
|---|---|---|
| 8,829,788 B2 | 9/2014 | Choi et al. |
| 2005/0077816 A1* | 4/2005 | Yamada .............. H01L 51/5228 313/503 |

(Continued)

FOREIGN PATENT DOCUMENTS

| | | |
|---|---|---|
| EP | 2 157 630 A2 | 2/2010 |
| EP | 3 343 634 A1 | 7/2018 |

(Continued)

OTHER PUBLICATIONS

Examination Report dated Jul. 13, 2020, issued in counterpart United Kingdom Patent Application No. GB1819373.0.
(Continued)

*Primary Examiner* — Meiya Li
(74) *Attorney, Agent, or Firm* — Morgan, Lewis & Bockius LLP

(57) ABSTRACT

Disclosed is an electroluminescent display device including a substrate, a first electrode provided on the substrate, a bank configured to cover an end of the first electrode and to define an emission area, and provided with a first receiving groove, an emission layer provided on the first electrode in the emission area defined by the bank, and a light absorbing layer provided in the first receiving groove of the bank, wherein the first receiving groove is formed in the bank, and the light absorbing layer is formed in the first receiving groove so that the external light is absorbed in the light absorbing layer, to thereby prevent the color interference and Haze phenomenon between the neighboring pixels.

34 Claims, 9 Drawing Sheets

(51) Int. Cl.
*H01L 27/32* (2006.01)
*H01L 51/52* (2006.01)

(52) U.S. Cl.
CPC ........ *H01L 51/5284* (2013.01); *H01L 27/322* (2013.01); *H01L 27/3279* (2013.01); *H01L 51/0005* (2013.01)

(58) Field of Classification Search
CPC ........... H01L 2251/558; H01L 27/3211; H01L 27/3279; H01L 51/0005; H01L 51/5203
See application file for complete search history.

(56) References Cited

U.S. PATENT DOCUMENTS

| | | | |
|---|---|---|---|
| 2014/0306601 A1* | 10/2014 | Kim | ................... H01L 51/50 313/506 |
| 2017/0077460 A1 | 3/2017 | Hayashida et al. | |
| 2017/0136633 A1 | 5/2017 | Zillich | |

FOREIGN PATENT DOCUMENTS

| | | |
|---|---|---|
| GB | 2544899 A | 5/2017 |
| JP | 2007-227275 A | 9/2007 |
| JP | 6214019 B2 | 10/2017 |
| KR | 10-1086580 B1 | 11/2011 |
| KR | 10-1431338 B1 | 8/2014 |
| KR | 2014-0124069 A | 10/2014 |
| KR | 10-2016-0081704 A | 7/2016 |
| KR | 10-1705564 B1 | 2/2017 |
| KR | 10-2017-0026462 A | 3/2017 |
| KR | 10-2017-0080887 A | 7/2017 |

OTHER PUBLICATIONS

Office Action dated Nov. 11, 2021, issued in counterpart Korean Patent Application No. 10-2017-0162461.

* cited by examiner

ELECTROLUMINESCENT DISPLAY DEVICE

The present application claims the benefit of Korean Patent Application No. 10-2017-0162461, filed Nov. 30, 2017, which is hereby incorporated by reference.

BACKGROUND

Technical Field

The present disclosure relates to an electroluminescent display device, and more particularly, to an electroluminescent display device capable of preventing problems caused by a reflection of external light.

Discussion of the Related Art

An electroluminescent display device is provided in such way that an emission layer is formed between two electrodes. According as the emission layer emits light by an electric field generated between the two electrodes, an image is displayed on the electroluminescent display device.

The emission layer may be formed of an organic material which emits light when exciton is produced by a bond of electron and hole, and the exciton falls to a ground state from an excited state, or may be formed of an inorganic material such as quantum dot.

Hereinafter, a related art electroluminescent display device will be described with reference to the accompanying drawings.

FIG. 1 is a cross sectional view illustrating a related art electroluminescent display device.

As shown in FIG. 1, the related art electroluminescent display device may include a substrate 10, a circuit device layer 20, a first electrode 30, a bank 40, an emission layer 50, a second substrate 60, and a color filter 70.

The circuit device layer 20 is formed on the first substrate 10. The circuit device layer 20 is provided with various signal lines, a thin film transistor, and a capacitor.

The first electrode 30 is formed on the circuit device layer 20. The first electrode 30 is patterned for each pixel, wherein the first electrode 30 functions as an anode electrode.

The bank 40 is formed in a matrix configuration, which defines an emission area.

The emission layer 50 is formed in the emission area defined by the bank 40.

The color filter 70 is formed on the second substrate 60. The color filter 70 may include red (R), green (G), and blue (B) color filters 70 patterned by each pixel. Thus, while light emitted from the emission layer 50 passes through the color filter 70, only the light having a predetermined wavelength penetrates therethrough. A predetermined wavelength may be considered to be the range of wavelengths which the color filter 70 transmits. For example, a red color filter has an associated predetermined wavelength corresponding to red light.

In case of the related art electroluminescent display device, after the external light which is provided from an upper side of the second substrate 60 passes through the bank 40, the light may be reflected on the circuit device layer 20. As described above, the circuit device layer 20 includes circuit devices such as the plurality of circuit lines, the thin film transistor, and the capacitor. Thus, when the external light is incident on the circuit device layer 20, the external light may be reflected on the circuit device included in the circuit device layer 20.

In this case, after the external light passes through the color filter 70 of any one pixel, the external light may be reflected on the circuit device layer 20 via the bank 40, and then emitted to another neighboring pixel which is adjacent to the corresponding pixel.

If the external light passes through the color filter 70 of any one pixel, only the light having a predetermined wavelength penetrates therethrough. If the light having a predetermined wavelength is reflected on the circuit device layer 20, and is then emitted to another neighboring pixel which is adjacent to the corresponding pixel, a color interference may be generated between the adjacent pixels, whereby it may cause a Haze phenomenon.

SUMMARY

Accordingly, embodiments of the present disclosure are directed to an electroluminescent display device that substantially obviates one or more of the problems due to limitations and disadvantages of the related art.

An aspect of the present disclosure is to provide an electroluminescent display device which is capable of preventing a color interference between adjacent pixels, and furthermore, capable of preventing a Haze phenomenon generated by a reflection of external light.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an electroluminescent display device comprises a substrate, a first electrode provided on the substrate, a bank configured to cover an end of the first electrode and to define an emission area, and provided with a first receiving groove, an emission layer provided on the first electrode in the emission area defined by the bank, a light absorbing layer provided in the first receiving groove of the bank, and a second electrode provided on the emission layer.

In another aspect, an electroluminescent display device comprises a substrate including an active area, and a dummy area prepared in the periphery of the active area, a bank disposed on the active area and the dummy area of the substrate, configured to define an emission area, and provided with a first receiving groove, an emission layer provided in the emission area defined by the bank, and a light absorbing layer provided in the first receiving groove of the bank, wherein a pattern of the bank provided in the active area is different from a pattern of the bank provided in the dummy area.

In a further aspect, an electroluminescent display device comprises a substrate including an active area, and a dummy area prepared in the periphery of the active area, a plurality of pixels provided in the active area, a plurality of dummy pixels provided in the dummy area, and a bank prepared in the boundary line between each of the plurality of pixels, and between each of the plurality of dummy pixels, wherein the bank includes a first receiving groove provided in the boundary line of the pixels which emit the different-colored light among the plurality of pixels, and a light absorbing layer is provided in the first receiving groove.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
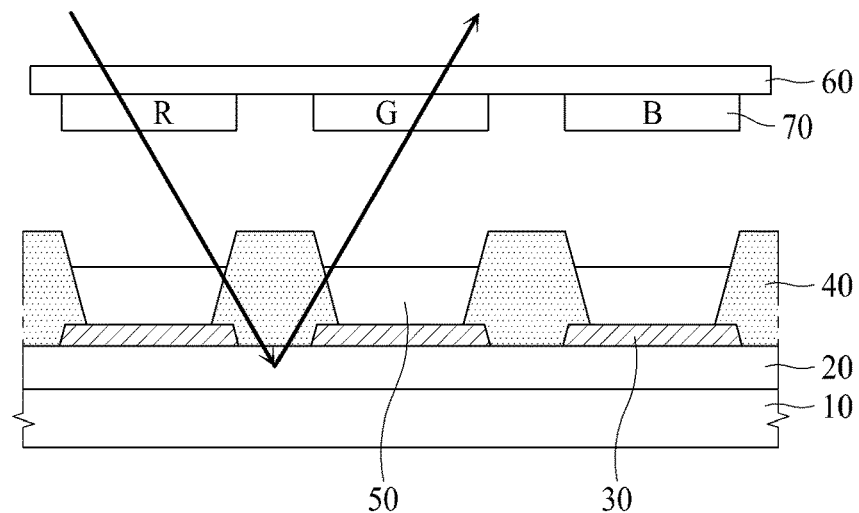
FIG. 1 is a cross sectional view illustrating a related art electroluminescent display device.

Advantages and features of the present disclosure, and implementation methods thereof will be clarified through the following embodiments, described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error region although there is no explicit description thereof In describing a positional relationship, for example, when the positional order is described as "on," "above," "below," and "next," the case of no contact therebetween may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, an electroluminescent display device according to the embodiment of the present disclosure will be described in detail with reference to the accompanying drawings.

Figure 2:
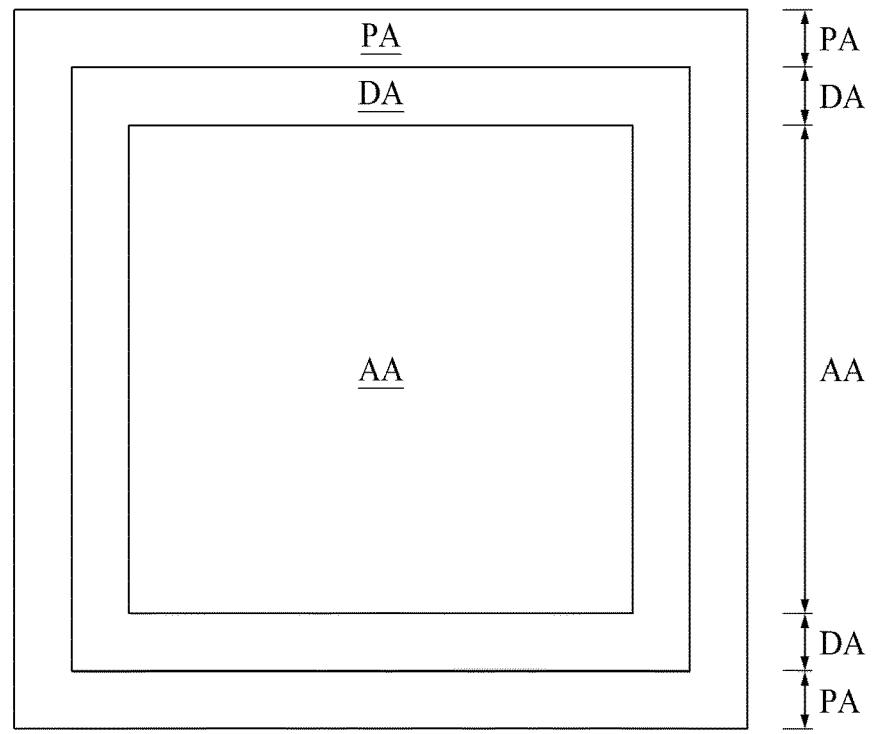
FIG. 2 is a plane view illustrating an electroluminescent display device according to one embodiment of the present disclosure.

FIG. 2 is a plane view illustrating an electroluminescent display device according to one embodiment of the present disclosure.

As shown in FIG. 2, the electroluminescent display device according to one embodiment of the present disclosure may include an active area (AA), a dummy area (DA), and a pad area (PA).

The active area (AA) serves as a display area for displaying an image. A plurality of pixels are provided in the active area (AA).

In detail, signal lines such as a gate line, a data line, a power line, and a reference line are provided in the pixel of the active area (AA). Also, a plurality of thin film transistors for switching a transmission of a signal applied through the signal line are provided in the pixel of the active area (AA), and an emission device which is driven in accordance with the plurality of thin film transistors so as to emit light is provided in the pixel of the active area (AA).

The dummy area (DA) is provided to surround the active area (AA).

In detail, the dummy area (DA) is provided at left, right, lower, and upper peripheral sides of the active area (AA). In the same manner as the active area (AA), a plurality of pixels are provided in the dummy area (DA). However, the dummy area (DA) is not the display area for displaying an image so that a structure of the pixel provided in the dummy area (DA) is different from a structure of the pixel provided in the active area (AA). For example, at least any one among the signal line, the thin film transistor and the emission device is not provided or incompletely provided in the pixel of the dummy area (DA), whereby light is not emitted from the pixel provided in the dummy area (DA).

The dummy area (DA) prevents a manufacturing error between a central portion of the active area (AA) and a peripheral portion of the active area (AA). This will be described in detail as follows.

A plurality of deposition processes and mask processes may be carried out in order to form the plurality of pixels in the active area (AA). The deposition process may be carried out so as to form an insulating layer, a metal layer or an organic layer through the use of physical deposition process, chemical deposition process, coating process or inkjet process. The mask process may be carried out so as to form a predetermined pattern having a predetermined shape in the insulating layer, metal layer or organic layer formed by the deposition process through the use of photolithography process.

If the plurality of deposition processes and mask processes are carried out in the active area (AA), there is a possibility of manufacturing error between the central portion of the active area (AA) and the peripheral portion of the active area (AA). According as the dummy area (DA) is provided in the periphery of the active area (AA), the manufacturing error may be generated in the dummy area (DA) instead of the active area (AA).

Especially, if the emission layer is formed inside the emission device by the use of inkjet process, dryness of the emission layer in the central portion of the substrate may be different from dryness of the emission layer in the peripheral portion of the substrate. In this case, if the dummy area (DA) is not provided, it may cause a problem related with non-uniformity of light emission between the central portion of the active area (AA) and the peripheral portion of the active area (AA).

Accordingly, the dummy area (DA) is provided in the periphery of the active area (AA). If forming the emission layer of the emission device by the inkjet process, the dryness may be not uniform in the emission layer between the active area (AA) and the dummy area (DA). Even in this case, the dryness of the emission layer may be wholly uniform inside the active area (AA) owing to the dummy area (DA) provided in the periphery of the active area (AA).

The pad area (PA) is provided in the periphery of the dummy area (DA).

A circuit driver such as a gate driver or a data driver may be prepared in the pad area (PA). The circuit driver may be provided in the periphery of at least one among left, right, lower, and upper sides of the dummy area (DA). The circuit driver prepared in the pad area (PA) is connected with the circuit device inside the active area (AA) via the dummy area (DA).

Figure 3:
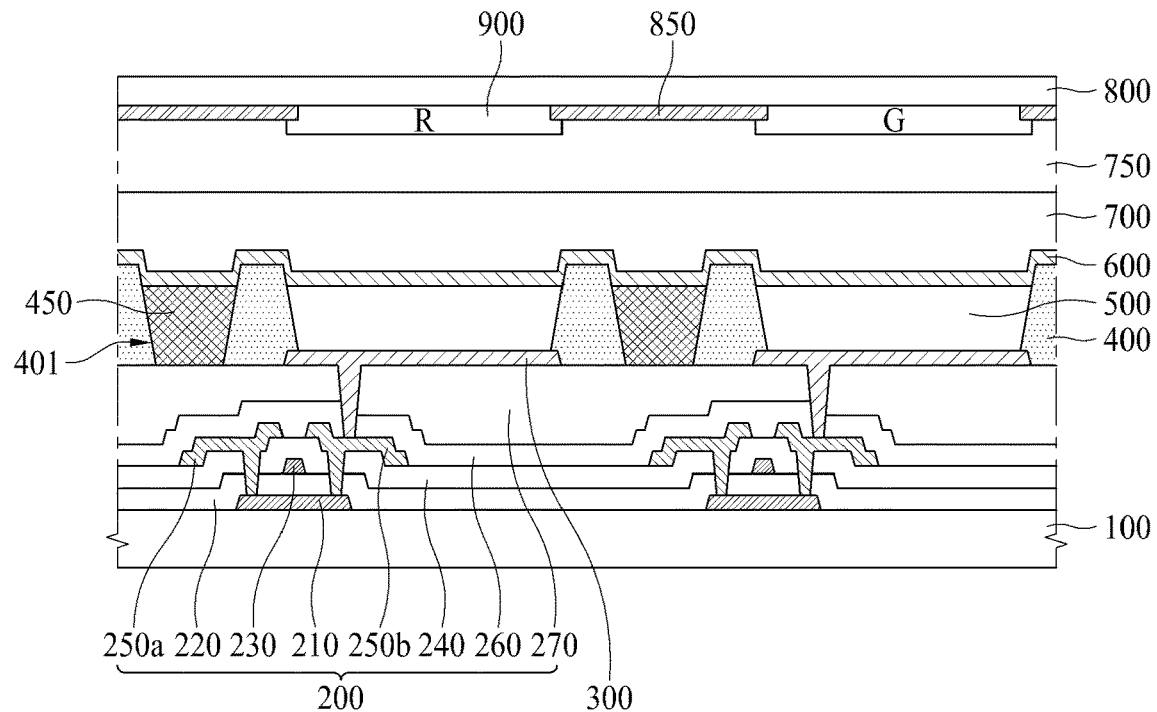
FIG. 3 is a cross sectional view illustrating an electroluminescent display device according to one embodiment of the present disclosure.

FIG. 3 is a cross sectional view illustrating an electroluminescent display device according to one embodiment of the present disclosure, which relates to an active area of the electroluminescent display device.

As shown in FIG. 3, the electroluminescent display device according to one embodiment of the present disclosure may include a first substrate 100, a circuit device layer 200, a first electrode 300, a bank 400, a light-absorbing layer 450, an emission layer 500, a second electrode 600, an encapsulation layer 700, an adhesive layer 750, a second substrate 800, a black matrix 850, and a color filter 900.

The first substrate 100 may be formed of a glass or plastic material, but not limited to this material. The first substrate 100 may be formed of a transparent material or an opaque material. The electroluminescent display device according to one embodiment of the present disclosure corresponds to a top emission type where light emitted from the emission layer 500 advances toward an upper side. Thus, the first substrate 100 may be formed of the opaque material as well as the transparent material.

The circuit device layer 200 is formed on the first substrate 100. The circuit device layer 200 may include an active layer 210, a gate insulating film 220, a gate electrode 230, an insulating interlayer 240, a source electrode 250a, a drain electrode 250b, a passivation layer 260, and a planarization layer 270.

The active layer 210 is formed on the first substrate 100. The active layer 210 may be formed of a silicon-based semiconductor material or an oxide-based semiconductor material, but not limited to this material. Although not shown, a light shielding layer may be additionally provided between the first substrate 100 and the active layer 210 so that it is possible to prevent light from being advanced to the active layer 210, to thereby prevent a deterioration of the active layer 210.

The gate insulating film 220 is formed on the active layer 210, wherein the gate insulating film 220 insulates the active layer 210 and the gate electrode 230 from each other.

The gate electrode 230 is formed on the gate insulating film 220.

The insulating interlayer 240 is formed on the gate electrode 230, wherein the insulating interlayer 240 insulates the gate electrodes 230 from the source/drain electrode 250a / 250b.

The source electrode 250a is provided at a predetermined interval from the drain electrode 250b, wherein the source electrode 250a and the drain electrode 250b confronting each other are provided on the insulating interlayer 240. The source electrode 250a and the drain electrode 250b are respectively connected with one end and the other end of the active layer 210 via contact holes provided in the insulating interlayer 240 and the gate insulating film 220.

The passivation layer 260 is provided on the source electrode 250a and the drain electrode 250b, to thereby protect the thin film transistor.

The planarization layer 270 is formed on the passivation layer 260, to thereby planarize an upper surface of the first substrate 100.

Accordingly, the circuit device layer 200 includes the thin film transistor having the gate electrode 230, the active layer 210, the source electrode 250a, and the drain electrode 250b. FIG. 3 shows the thin film transistor having the top gate structure where the gate electrode 230 is provided above the active layer 210, but not limited to this type. For example, the thin film transistor having a bottom gate structure where the gate electrode 230 is provided below the active layer 210 may be provided in the circuit device layer 200.

In the circuit device layer 200, the circuit device having various signal lines, the thin film transistor, and the capacitor is provided by each pixel. The signal lines may include a gate line, a data line, a power line, and a reference line. The thin film transistor may include a switching thin film transistor, a driving thin film transistor, and a sensing thin film transistor. The thin film transistor shown in FIG. 3 corresponds to the driving thin film transistor.

According as the switching thin film transistor is switched in accordance with a gate signal supplied to the gate line, a data voltage provided from the data line is supplied to the driving thin film transistor.

According as the driving thin film transistor is switched in accordance with the data voltage supplied from the switching thin film transistor, a data current is generated by power supplied from the power line, and the generated data current is supplied to the first electrode 300.

The sensing thin film transistor senses a threshold voltage deviation of the driving thin film transistor, which causes a deterioration of picture quality. The sensing thin film transistor supplies a current of the driving thin film transistor to the reference line in response to a sensing control signal supplied from the gate line or an additional sensing line.

The capacitor maintains the data voltage supplied to the driving thin film transistor for one frame period. The capacitor is connected with each of gate and source terminals of the driving thin film transistor.

The electroluminescent display device of FIG. 3 corresponds to a top emission type. That is, even though the thin film transistor is disposed below the emission layer 500, the light emission is not influenced by the thin film transistor. Thus, the thin film transistor may be disposed below the emission layer 500.

The first electrode 300 is formed on the circuit device layer 200.

The first electrode 300 is patterned by each pixel, wherein the first electrode 300 functions as an anode of the electroluminescent display device. The electroluminescent display device according to one embodiment of the present disclosure corresponds to the top emission type. The first electrode 300 may include a reflective material for upwardly reflecting the light emitted from the emission layer 500. In this case, the first electrode 300 may be formed in a deposition structure including a transparent conductive material and the above reflective material.

The first electrode 300 is connected with the drain electrode 250b of the thin film transistor via the contact hole provided in the planarization layer 270 and the passivation layer 260. If needed, the first electrode 300 may be connected with the source electrode 250a of the thin film transistor via the contact hole provided in the planarization layer 270 and the passivation layer 260.

The bank 400 is formed in the boundary line between the adjoining pixels. That is, the bank 400 is formed in a matrix configuration to define an emission area.

The bank 400 is provided on the planarization layer 270 while being configured to cover both ends of the first electrode 300. Thus, the plurality of first electrodes 300, which are formed by each pixel, may be insulated by the bank 400.

A first receiving groove 401 is provided in the bank 400. The first receiving groove 401 is provided from an upper end of the bank 400 to a lower end of the bank 400, whereby the first receiving groove 401 penetrates a predetermined portion of the bank 400. Accordingly, the planarization layer 270 may be exposed by the first receiving groove 401. The first receiving groove 401 is not overlapped with the first electrode 300, whereby the first electrode 300 is not exposed by the first receiving groove 401.

The light absorbing layer 450 is provided in the first receiving groove 401 of the bank 400. The light absorbing layer 450 prevents externally-provided incident light from being advanced toward the circuit device layer 200, or prevents externally-provided incident light from being reflected on the circuit device layer 200 and being advanced upwardly.

In all described embodiments with a light absorbing layer 450 in a groove in a bank, as an alternative, the bank may be configured to absorb light due to the bank being formed from a material that absorbs light. This type of light absorbing bank may be considered as a black bank. Any form of black bank that prevents externally-provided incident light from advancing toward the circuit device layer 200, or prevents externally-provided incident light from being reflected on the circuit device layer 200 and being advanced upwardly may be used regardless of whether the black bank comprises a groove.

If the externally-provided incident light provided from the upper side of the second substrate 800 passes through the color filter 900 of any one pixel, only the light having a predetermined wavelength penetrates therethrough. The light having a predetermined wavelength, which penetrates through the color filter 900, sequentially passes through the adhesive layer 750, the encapsulation layer 700, the second electrode 600, and the bank 400, and then the light reaches the circuit device layer 200. Thereafter, the light is reflected on the circuit device inside the circuit device layer 200, and is then emitted to another pixel. In this case, a color interference occurs in the adjacent pixels, to thereby generate a Haze phenomenon.

Accordingly, in case of the electroluminescent display device according to one embodiment of the present disclosure, the first receiving groove 401 is formed in the bank 400, and the light absorbing layer 450 is formed in the first receiving groove 401, whereby the externally-provided light is absorbed in the light absorbing layer 450. Especially, as the first receiving groove 401 penetrates from the upper end of the bank 400 to the lower end of the bank 400, the amount of the light absorbing layer 450 received in the first receiving groove 401 is increased so that the amount of absorbed light is also increased.

Accordingly, the light absorbing layer 450 prevents the externally-provided light from being advanced toward the circuit device layer 200, or prevents the light from being reflected on the circuit device layer 200 and being advanced upwardly so that it is possible to prevent the color interference between the adjacent pixels, and furthermore, Haze phenomenon.

The light absorbing layer 450 may include an inorganic material or organic material having a black-based color, but not necessarily. For example, the light absorbing layer 450 may include various light absorbents generally known to those in the art.

The emission layer 500 is formed on the first electrode 300. Especially, the emission layer 500 is formed in the emission area defined by the bank 400. The emission layer 500 may emit red (R) light, green (G) light, or blue (B) light, but not limited to these colors. If needed, the emission layer 500 may emit white light.

The emission layer 500 may be patterned by each pixel in an evaporation method using a mask, or may be patterned by each pixel in a liquid process using an inkjet apparatus without a mask.

The emission layer 500 may include at least one organic layer among a hole injecting layer, a hole transporting layer, an organic emitting layer, an electron transporting layer, and an electron injecting layer.

The second electrode 600 is formed on the emission layer 500, wherein the second electrode 600 may function as a cathode of the electroluminescent display device.

The second electrode 600 may be provided on the bank 400 and the light absorbing layer 450 as well as the emission layer 500, wherein the second electrode 600 may be formed in the plurality of emission areas. The second electrode 600 may be formed in the entire area of the active area. Thus, the second electrode 600 may function as a common electrode for applying a common voltage to the plurality of pixels.

The encapsulation layer 700 is formed on the second electrode 600. The encapsulation layer 700 prevents external moisture from being permeated into the emission layer 500. The encapsulation layer 700 may be formed of an inorganic insulating material, or may be formed in a deposition structure obtained by alternately depositing inorganic and organic insulating materials, but not limited to these structures.

The adhesive layer 750 is provided to adhere the first substrate 100 and the second substrate 800 to each other. The adhesive layer 750 is formed between the encapsulation layer 700 of the first substrate 100 and the black matrix 850 of the second substrate 800, and between the encapsulation layer 700 of the first substrate 100 and the color filter 900 of the second substrate 800. The adhesive layer 750 may include components for preventing the permeation of external moisture.

An image is displayed on the second substrate 800. Thus, the second substrate 800 may be formed of a transparent material such as glass or plastic.

The black matrix 850 is formed on an internal surface of the second substrate 800, that is, a lower surface of the second substrate 800 confronting the first substrate 100. The black matrix 850 may be provided in the boundaries of the plurality of pixels, to thereby prevent light leakage in the boundaries of the plurality of pixels. The black matrix 850 is formed in a matrix configuration corresponding to the bank 400.

The color filter 900 is disposed in the pixel area which is not provided with the black matrix 850. The color filter 900 may be partially overlapped with the black matrix 850. The color filter 900 may be over the emission layer 500. While light emitted from the emission layer 500 passes through the color filter 900, only the light having a predetermined wavelength may penetrate therethrough. The color filter 900 may include a red (R) color filter, a green (G) color filter, and a blue (B) color filter, which is patterned by each pixel.

The light absorbing layer 450 prevents the external light passing through the color filter 900 of any one pixel region from being reflected and advanced toward another pixel region, to thereby prevent the color interference between the adjacent pixel regions and the Haze phenomenon. In embodiments in which the color filter 900 is not provided, there is still a possibility of the color interference between the adjacent pixel region and the Haze phenomenon caused by the reflection of the external light. Therefore, even if there is no color filter 900, the light absorbing layer 450 may be provided. That is, the electroluminescent display device according to the present disclosure may include embodiments having no color filter 900 as well as embodiments having a color filter 900. The light absorbing layer 450 is especially favorable to embodiments having a color filter 900.

Figure 4:
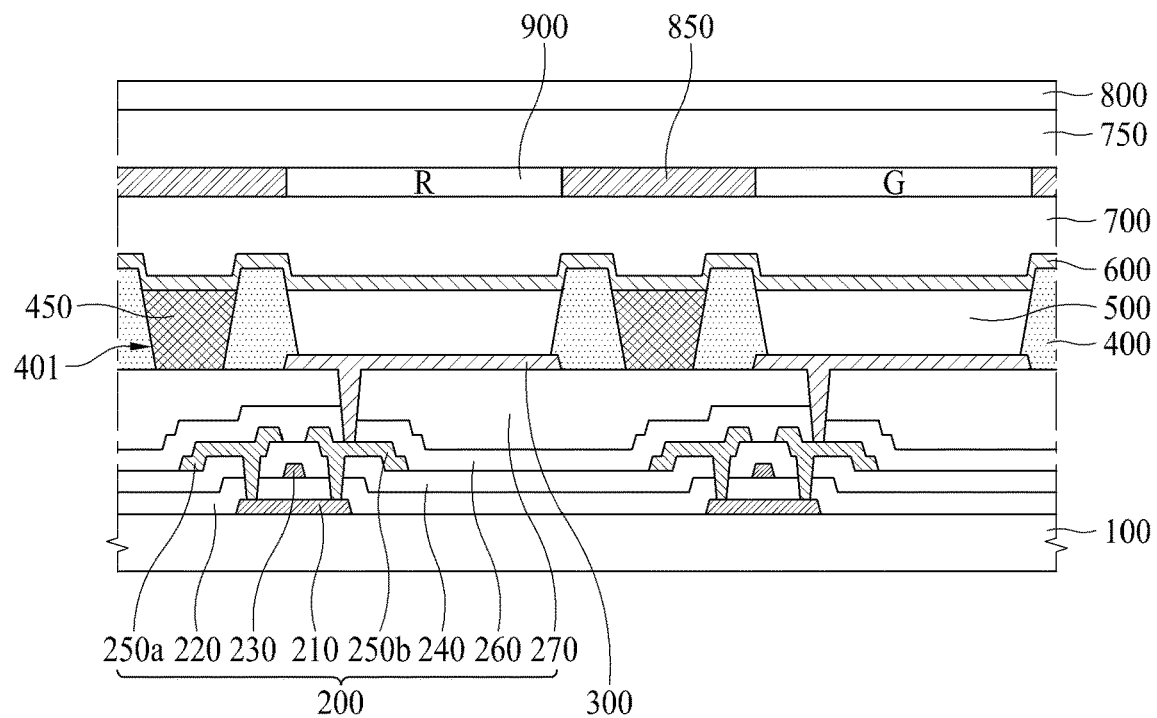
FIG. 4 is a cross sectional view illustrating an electroluminescent display device according to another embodiment of the present disclosure.

FIG. 4 is a cross sectional view illustrating an electroluminescent display device according to another embodiment of the present disclosure. Except a black matrix 850 and a color filter 900, the electroluminescent display device of FIG. 4 is identical in structure to the electroluminescent display device of FIG. 3, whereby the same reference numbers will be used throughout the drawings to refer to the same parts. Hereinafter, only the different structure will be described in detail as follows.

Referring to FIG. 3, the black matrix 850 and the color filter 900 are formed on the second substrate 800, whereby the adhesive layer 750 is provided between the encapsulation layer 700 of the first substrate 100 and the black matrix 850 of the second substrate 800, and between the encapsulation layer 700 of the first substrate 100 and the color filter 900 of the second substrate 800.

Meanwhile, referring to FIG. 4, a black matrix 850 and a color filter 900 are provided on an encapsulation layer 700 of a first substrate 100. Thus, an adhesive layer 750 is formed between the black matrix 850 of the first substrate 100 and a second substrate 800, and between the color filter 900 of the first substrate 100 and the second substrate 800.

Figure 5A:
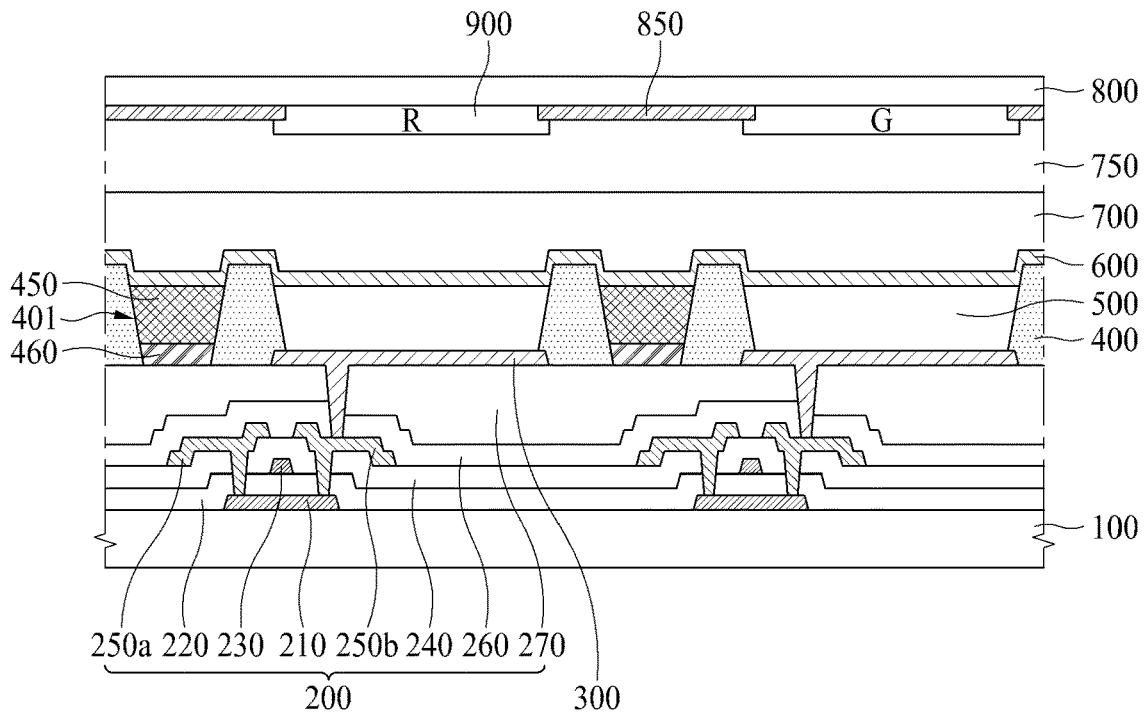
FIGS. 5A and 5B are cross sectional views illustrating an electroluminescent display device according to another embodiment of the present disclosure.
Figure 5B:
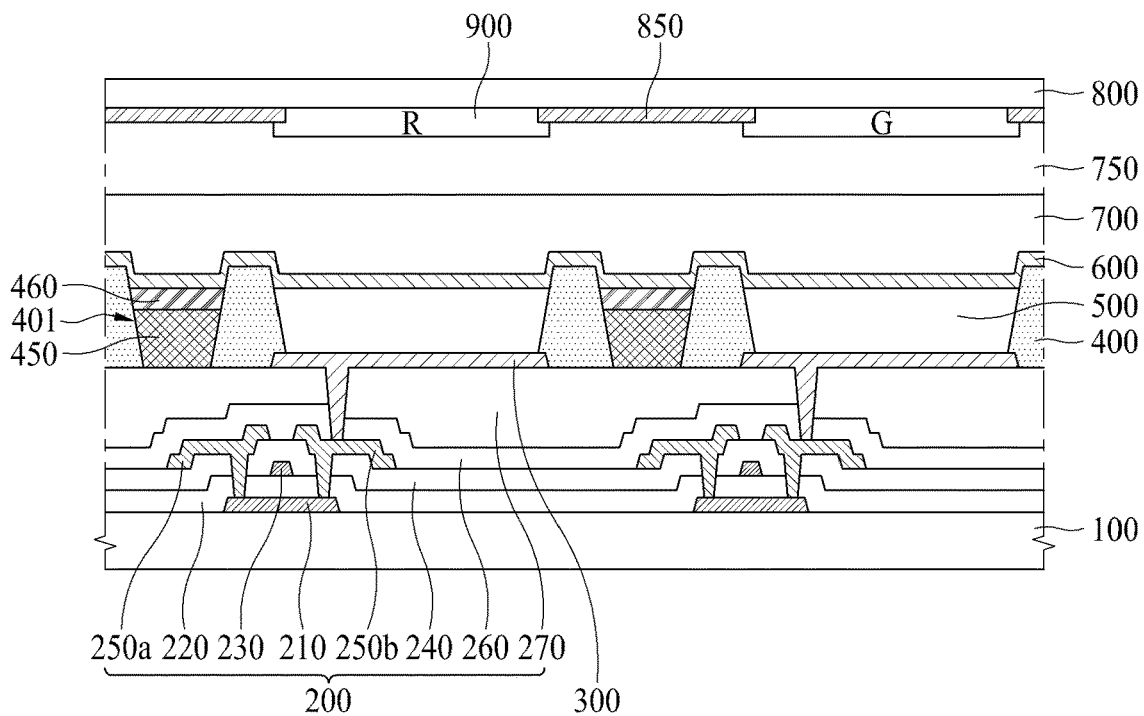

FIGS. 5A and 5B are cross sectional views illustrating an electroluminescent display device according to another embodiment of the present disclosure. Except that a gas absorbing layer 460 is additionally provided in a first receiving groove 401 of a bank 400, the electroluminescent display device of FIGS. 5A and 5B is identical in structure to the electroluminescent display device of FIG. 3, whereby the same reference numbers will be used throughout the drawings to refer to the same parts. Hereinafter, only the different structure will be described in detail as follows.

As shown in FIG. 5A, according to another embodiment of the present disclosure, a light absorbing layer 450 is provided in a first receiving groove 401 of a bank 400, and a gas absorbing layer 460 is provided under a lower surface of the light absorbing layer 450. That is, the gas absorbing layer 460 and the light absorbing layer 450 are sequentially provided in the first receiving groove 401 of the bank 400.

The gas absorbing layer 460 is formed on a planarization layer 270, and the light absorbing layer 450 is formed on the gas absorbing layer 460.

The gas absorbing layer 460 absorbs gas generated by an outgassing phenomenon in the planarization layer 270, to thereby prevent a shortened lifespan of the device by the generated gas.

If an emission layer 500 is formed in an emission area by a liquid process, the emission layer 500 is treated with a baking process at a high temperature. For the baking process, the outgassing phenomenon is generated in the planarization layer 270, whereby gas may permeate into the emission layer 500, to thereby cause a shortened lifespan of the device. According to another embodiment of the present disclosure, the gas absorbing layer 460 is additionally provided below the light absorbing layer 450 so that it is possible to prevent the gas generated by the outgassing phenomenon from being permeated into the emission layer 500.

The gas absorbing layer 460 may include various gas absorbents generally known to those in the art.

As shown in FIG. 5B, according to another embodiment of the present disclosure, a light absorbing layer 450 is formed in a first receiving groove 401 of a bank 400, and a gas absorbing layer 460 is formed on an upper surface of the light absorbing layer 450. That is, the light absorbing layer 450 and the gas absorbing layer 460 are sequentially provided in the first receiving groove 401 of the bank 400.

As shown in the above FIG. 5A, the gas absorbing layer 460 is provided under the light absorbing layer 450 while being in contact with the planarization layer 270, whereby the gas absorbing layer 460 directly absorbs gas generated in the planarization layer 270.

Meanwhile, as shown in the above FIG. 5B, the gas absorbing layer 460 is provided above the light absorbing layer 450 while being not in contact with the planarization layer 270. Thus, gas generated in the planarization layer 270 may be discharged to the end of the first substrate 100 through the inside of the planarization layer 270, and the gas discharged to the end of the first substrate 100 may be moved to the upper side of the emission layer 500 and the bank 400. In the embodiment of FIG. 5B, the gas absorbing layer 460 is disposed on the light absorbing layer 450 so as to absorb the gas which is moved to the upper side of the emission layer 500 and the bank 400.

Although not shown, the gas absorbing layer 460 may be provided on each of lower and upper surfaces of the light absorbing layer 450. Also, instead of the gas absorbing layer 460 additionally provided as shown in FIGS. 5A and 5B, the light absorbing layer 450 may include gas absorbents. In addition, the light absorbing layer 450 may include the gas absorbing layer 460 as well as the gas absorbents.

In FIGS. 5A and 5B, it is possible to change the black matrix 850 and the color filter 900 into the structure of FIG. 4.

Figure 6:
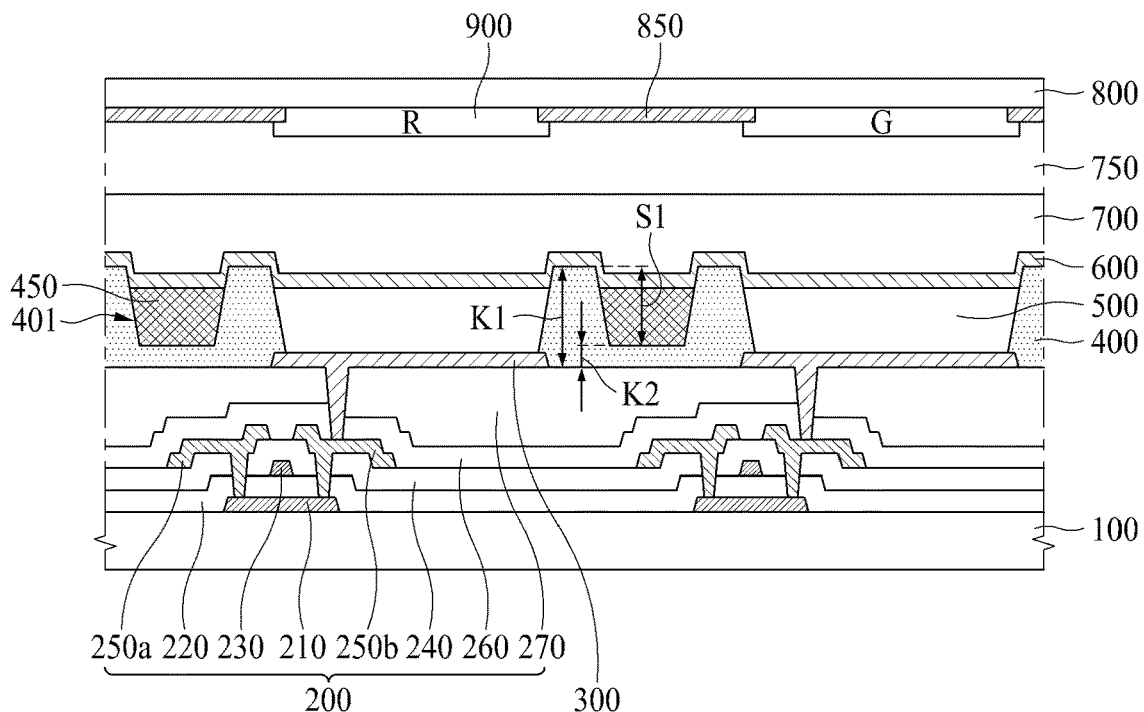
FIG. 6 is a cross sectional view illustrating an electroluminescent display device according to another embodiment of the present disclosure.

FIG. 6 is a cross sectional view illustrating an electroluminescent display device according to another embodiment of the present disclosure. Except a first receiving groove 401 of a bank 400, the electroluminescent display device of FIG. 6 is identical in structure to the electroluminescent display device of FIG. 3, whereby the same reference numbers will be used throughout the drawings to refer to the same parts. Hereinafter, only the different structure will be described in detail as follows.

Referring to the above FIG. 3, the first receiving groove 401 is provided from an upper end of the bank 400 to a lower end of the bank 400, whereby the first receiving groove 401 penetrates a portion of the bank 400 so that the light absorbing layer 450 is formed on the planarization layer 270 exposed by the first receiving groove 401.

Meanwhile, referring to FIG. 6, when a first receiving groove 401 is provided in a bank 400, the first receiving groove 401 does not penetrate through the bank 400 from an upper end of the bank 400 to a lower end of the bank 400. The upper end of the bank 400 is the top of the bank 400, and the lower end of the bank is the bottom of the bank 400. Thus, the bank 400 remains in the first receiving groove 401, whereby a lower surface of a light absorbing layer 450 is formed on the bank 400 inside the first receiving groove 401.

That is, some area of the bank 400 which is not provided with the first receiving groove 401 has a first height (k1), and the remaining area of the bank 400 which is provided with the first receiving groove 401 has a second height (k2). In this case, the second height (k2) is lower than the first height (k1). Thus, the first receiving groove 401 has a first depth (s1) which is smaller than the first height (k1). Accordingly, a lower surface of the light absorbing layer 450 is in contact with the remaining area of the bank 400 which is provided with the first receiving groove 401.

If an emission layer 500 is formed by an inkjet process, a lower side of the bank 400 has the hydrophilic property, and an upper side of the bank 400 has the hydrophobic property, preferably. This is because the emission layer 500 easily spreads to the lower side of the bank 400 having the hydrophilic property, and the emission layer 500 does not spread to the upper side of the bank 400 having the hydrophobic property. Thus, it is possible to prevent the emission layer 500 from being permeated into another neighboring emission area. This will be readily understood with reference to the following description related with another embodiment of FIG. 7.

In this case, the light absorbing layer 450 may be formed by the inkjet process. In this case, as shown in FIG. 6, if the light absorbing layer 450 is formed in the lower side of the bank 400 having the hydrophilic property, the light absorbing layer 450 smoothly spreads to the lower side of the bank 400 having the hydrophilic property, and the light absorbing layer 450 does not spread to the upper side of the bank 400 having the hydrophobic property so that it is possible to prevent the light absorbing layer 450 from being permeated into the emission area.

Meanwhile, although not shown, in case of the structure shown in FIG. 6, it is possible to change the black matrix 850 and the color filter 900 into the structure of FIG. 4. Also, in case of the structure shown in FIG. 6, the gas absorbing layer 460 may be additionally formed in the first receiving groove 401 shown in FIGS. 5A and 5B.

Figure 7:
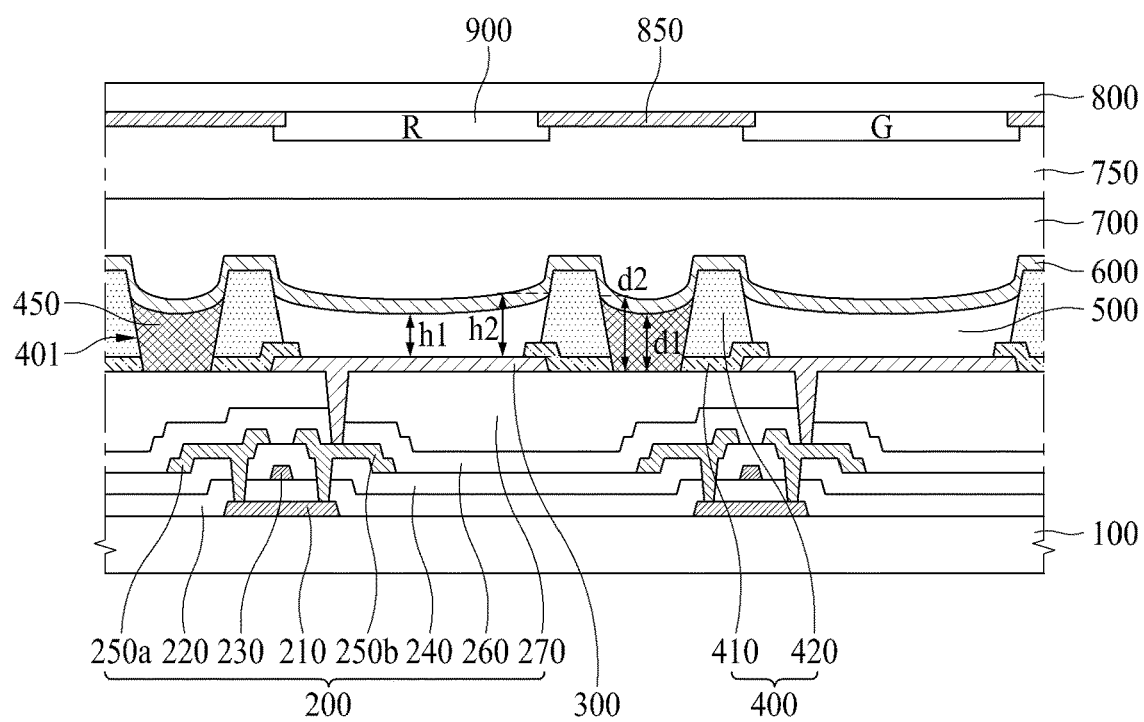
FIG. 7 is a cross sectional view illustrating an electroluminescent display device according to another embodiment of the present disclosure.

FIG. 7 is a cross sectional view illustrating an electroluminescent display device according to another embodiment of the present disclosure. Except structures of a bank 400, an emission layer 500, and a light absorbing layer 450, the electroluminescent display device of FIG. 7 is identical in structure to the electroluminescent display device of FIG. 3, whereby the same reference numbers will be used throughout the drawings to refer to the same parts. Hereinafter, only the different structure will be described in detail as follows.

As shown in FIG. 7, in case of the electroluminescent display device according to another embodiment of the present disclosure, a bank 400 includes a first bank 410 and a second bank 420.

The first bank 410, which covers an end of a first electrode 300, is formed on a circuit device layer 200. The first bank 410 has a relatively smaller thickness in comparison to the second bank 420, and has a relatively larger width in comparison to the second bank 420. In the same manner as an emission layer 500, the first bank 410 having the above structure has the hydrophilic property. The first bank 410 having the hydrophilic property may be formed of an inorganic insulating material such as a silicon oxide. Accordingly, if an emission layer 500 is formed by an inkjet process, a solution for forming the emission layer 500 may easily spread on the first bank 410. Height is measured in a direction perpendicular to the surface of the substrate, and width is measured in a direction parallel with the surface of the substrate. The height of an emission area is measured from the upper surface of the first electrode 300. The height of a second electrode 600 is also measured from the upper surface of the first electrode 300. The height of a bank 400 is measured from the upper surface of the planarization layer 270. The edge of the emission area may be considered to the upper surface of the emission area that is in direct contact with the bank. The upper surface of a feature is the surface of the feature furthest from the first substrate and parallel to the surface of the substrate.

The second bank 420 is formed on the first bank 410. A width of the second bank 420 is relatively smaller than a width of the first bank 410. The second bank 420 may be obtained by coating a mixture solution of an organic insulating material having the hydrophilic property and a hydrophobic material such as fluorine, and patterning the coated mixture solution by the use of photolithography process. By the light irradiated for the photolithography process, the hydrophobic material such as fluorine may move to an upper portion of the second bank 420, whereby the upper portion of the second bank 420 has the hydrophobic property, and the remaining portions of the second bank 420 has the hydrophilic property. That is, the lower portion of the second bank 420 which is in contact with the first bank 410 has the hydrophilic property, and the upper portion of the second bank 420 has the hydrophobic property, but not limited to this structure. The entire portions of the second bank 420 may have the hydrophobic property.

Herein, spreadability of the solution for forming the emission layer 500 may be improved owing to the first bank 410 having the hydrophilic property and the lower portion of the second bank 420 having the hydrophilic property. Especially, as the first bank 410 has the relatively smaller thickness and the relatively larger width in comparison to the second bank 420, it is possible to prepare a 2-step structure of the hydrophilic property by the combination of the first bank 410 and second bank 420, whereby the solution for forming the emission layer 500 may easily spread to the left and right ends of the emission area.

Also, the upper portion of the second bank 420 having the hydrophobic property prevents the solution for forming the emission layer 500 from spreading to another neighboring emission area so that it is possible to prevent the emission layer 500 of one emission area from being mixed with the emission layer 500 of another neighboring emission area.

The first bank or the second bank may have a linear structure. A linear structure being a straight line structure, i.e. the bank extends along a first direction and has a constant cross-section perpendicular to the first direction. The first bank may be formed as a mesh structure, which is a structure comprising a single layer that provides a plurality of regular apertures, typically being rectangular apertures arranged in a rectangular array, that define a regular pattern of emission areas in the active area. An electroluminescent display device may comprise a plurality of second banks of linear structure that are parallel to each other, and that are formed on top of a first bank having a mesh structure. An electroluminescent display device may comprise a plurality of second banks of linear structure that are parallel to each other, and that are formed on top of a plurality of first banks of linear structure that are parallel to each other and perpendicular to the linear structure of the second banks. A bank with a linear structure may only have such a structure in the active area. In some cases, a bank may be formed of a plurality of linear structures that are parallel to each other, and that are connected in the dummy area surrounding the active area, forming a snaking pattern.

The emission layer 500 is formed on the first electrode 300. The emission layer 500 may be formed by the inkjet process. If the emission layer 500 is formed by the inkjet process, a height (h1) of an upper end of the emission layer 500 in the center of the emission area after a drying process of drying the solution for forming the emission layer 500 is lower than a height (h2) of an upper end of the emission layer 500 at the end of the emission area. Especially, as shown in the drawings, according as the height of the emission layer 500 is gradually lowered from the end of the emission area to the center of the emission area, it is possible to realize a gradually-lowered profile shape. Accordingly, a predetermined portion of a second electrode 600 formed on the emission layer 500 has a profile corresponding the profile of the emission layer 500.

A light absorbing layer 450 is provided in a first receiving groove 401 of the bank 400. The first receiving groove 401 penetrates through the first bank 410 and the second bank 420.

In the same manner as the emission layer 500, the light absorbing layer 450 may be formed by the inkjet process. If the light absorbing layer 450 is formed by the inkjet, a height (d1) of an upper end of the light absorbing layer 450 at the center inside the first receiving groove 401 after the drying process of drying the solution for forming the light absorbing layer 450 is lower than a height (d2) of an upper end of the light absorbing layer 450 at the end inside the first receiving groove 401, which may be considered the edge of the light absorbing layer 450. Especially, as shown in the drawings, according as the height of the light absorbing layer 450 is gradually lowered from the end inside the first receiving groove 401 to the center inside the first receiving groove 401, it is possible to realize a gradually-lowered profile shape. The height of the light absorbing layer is measured from the planarization layer 270.

If the light absorbing layer 450 is formed by the inkjet process, it is possible to use the solution obtained by dissolving a light absorbent including a black-colored inorganic or organic material in hydrocarbon-based, ether-based or ester-based solvent.

Meanwhile, although not shown, in case of the structure shown in FIG. 7, it is possible to change the black matrix 850 and the color filter 900 into the structure of FIG. 4. In the structure of FIG. 7, the gas absorbing layer 460 may be additionally formed in the first receiving groove 401, as shown in FIGS. 5A and 5B. In the structure of FIG. 7, the first receiving groove 401 does not penetrate through the bank 400, as shown in FIG. 6. In this case, the first receiving groove 401 may penetrate through the second bank 420, but not penetrate through the first bank 410, or the first receiving groove 401 may not penetrate through the first bank 410 and the second bank 420.

Figure 8:
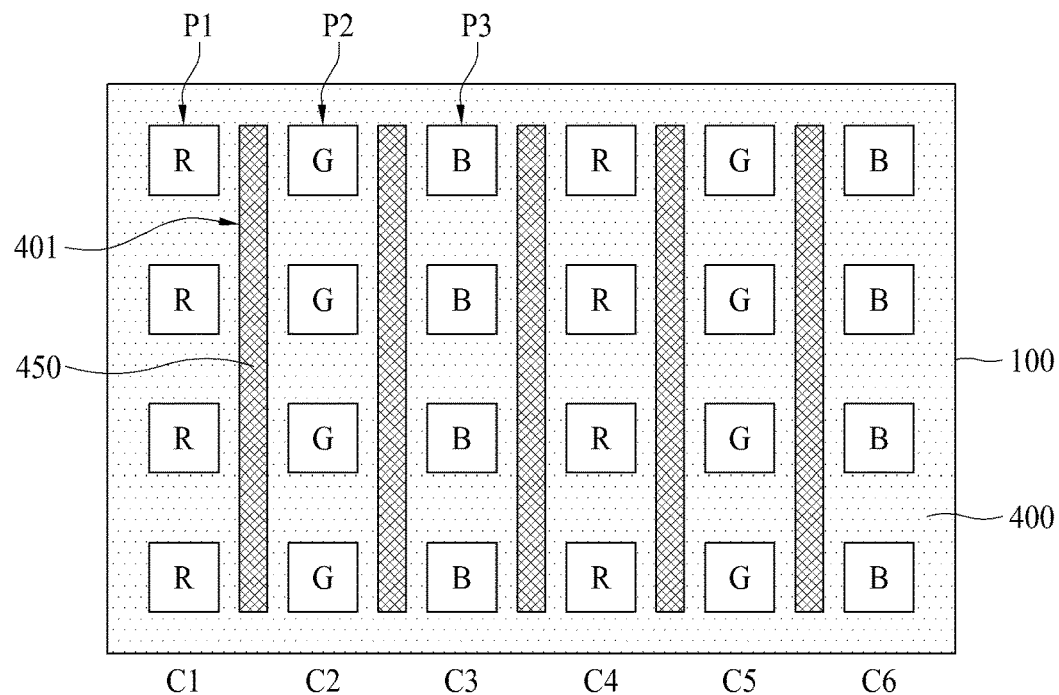
FIG. 8 is a plane view illustrating an electroluminescent display device according to one embodiment of the present disclosure.

FIG. 8 is a plane view illustrating an electroluminescent display device according to one embodiment of the present disclosure, which shows an active area (AA).

As shown in FIG. 8, a plurality of pixels (P1, P2, P3) are provided on a first substrate 100, and a bank 400 is provided in the area between each of the plurality of pixels (P1, P2, P3). The bank 400 is formed in a matrix configuration along the boundary lines between the plurality of pixels (P1, P2, P3).

The plurality of pixels (P1, P2, P3) may include the first pixel (P1), the second pixel (P2), and the third pixel (P3). The first pixel (P1) emits first-colored light, for example, red (R) light, the second pixel (P2) emits second-colored light, for example, green (G) light, and the third pixel (P3) emits third-colored light, for example, blue (B) light.

The first pixel (P1), the second pixel (P2), and the third pixel (P3) are aligned in columns. For example, the plurality of first pixels (P1) are aligned in the first column (C1) and the fourth column (C4), the plurality of second pixels (P2) are aligned in the second column (C2) and the fifth column (C5), and the plurality of third pixels (P3) are aligned in the third column (C3) and the sixth column (C6).

In the structure shown in FIG. 8, if the external light which is incident on the first pixel (P1) of the first column (C1) is reflected and then advanced toward the second pixel (P2) of the second column (C2), it may cause the color interference and Haze phenomenon in the second pixel (P2). Also, if the external light which is incident on the second pixel (P2) of the second column (C2) is reflected and then advanced toward the first pixel (P1) of the first column (C1) or the third pixel (P3) of the third column (C3), it may cause the color interference and Haze phenomenon in the first pixel (P1) or the third pixel (P3).

Accordingly, the bank 400 is provided with the first receiving groove 401 in the area between the pixel column of the first column (C1) provided with the plurality of first pixels (P1) and the pixel column of the second column (C2) provided with the plurality of second pixels (P2), and the light absorbing layer 450 is provided in the first receiving groove 401. That is, according as the light absorbing layer 450 is provided in the area between the pixel column of the first column (C1) and the pixel column of the second column (C2), it is possible to prevent the color interference and Haze phenomenon between the first pixel (P1) and the second pixel (P2).

Also, the bank 400 is provided with the first receiving groove 401 in the area between the pixel column of the second column (C2) and the pixel column of the third column (C3), and the light absorbing layer 450 is provided in the first receiving groove 401 so that it is possible to prevent the color interference and Haze phenomenon between the second pixel (P2) and the third pixel (P3).

Also, the bank 400 is provided with the first receiving groove 401 in the area between the pixel column of the third column (C3) and the pixel column of the fourth column (C4), and the light absorbing layer 450 is provided in the first receiving groove 401 so that it is possible to prevent the color interference and Haze phenomenon between the third pixel (P3) and the first pixel (P1).

However, the first receiving groove 401 and the light absorbing layer 450 are not formed in the area between each of the plurality of pixels (P1, P2, P3) included in the same column (C1, C2, C3). That is, the plurality of first pixels (P1) aligned in the first column (C1) emit the same-colored light of the first-colored light. Thus, even though there is the reflection of the external light, the problems related with the color interference and Haze phenomenon are not generated. Thus, the first receiving groove 401 and the light absorbing layer 450 are not formed in the area between each of the plurality of first pixels (P1) aligned in the first column (C1). In the same manner, the first receiving groove 401 and the light absorbing layer 450 are not formed in the area between each of the plurality of second pixels (P2) aligned in the second column (C2), and also not formed in the area between each of the plurality of third pixels (P3) aligned in the third column (C3).

Eventually, according to one embodiment of the present disclosure, the first receiving groove 401 and the light absorbing layer 450 are formed in the boundary line between the neighboring pixels (P1, P2, P3) which emit the different-colored light so that it is possible to prevent the color interference and Haze phenomenon between the neighboring pixels (P1, P2, P3) which emit the different-colored light. Especially, the first receiving groove 401 and the light absorbing layer 450 are formed in a straight-line structure extending in a first direction on the boundary line between the neighboring pixel columns, to thereby realize a stripe structure by repeatedly providing the above straight-line structure.

Figure 9:
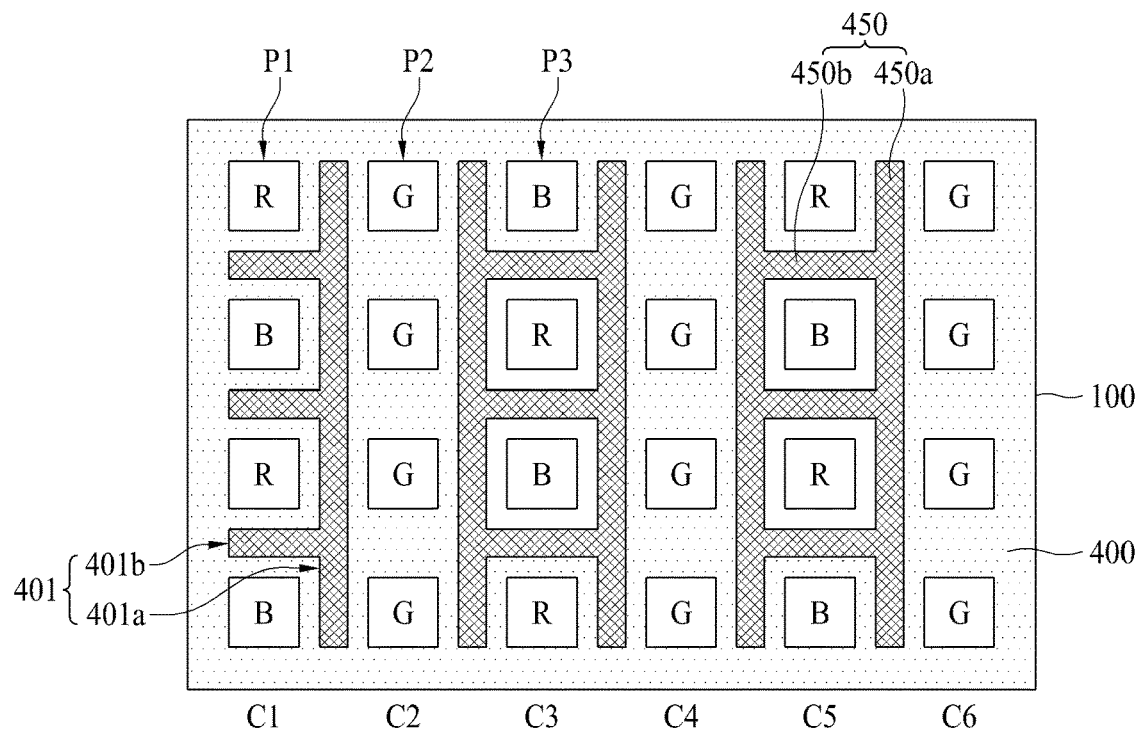
FIG. 9 is a plane view illustrating an electroluminescent display device according to another embodiment of the present disclosure.

FIG. 9 is a plane view illustrating an electroluminescent display device according to another embodiment of the present disclosure, which shows an active area (AA).

As shown in FIG. 9, a plurality of first pixels (P1) for emitting first-colored light of red (R) light, a plurality of second pixels (P2) for emitting second-colored light of green (G) light, and a plurality of third pixels (P3) for emitting third-colored light of blue (B) light may be provided on a first substrate 100, and a bank 400 is formed in a matrix configuration along the boundary line between the plurality of pixels (P1, P2, P3).

In this case, the first pixel (P1) and the third pixel (P3) which emit the different-colored light are alternately provided in the odd-numbered column, for example, the first column (C1), the third column (C3), and the fifth column (C5), and the plurality of second pixels (P2) which emit the same-colored light are provided in the even-numbered column, for example, the second column (C2), the fourth column (C4), and the sixth column (C6).

In this pixel structure, the bank 400 is provided with the first receiving groove 401 in the area between the neighboring pixel columns, for example, the area between the first column (C1) and the second column (C2), the area between the second column (C2) and the third column (C3), and the area between the third column (C3) and the third column (C3), and the light absorbing layer 450 is provided in the first receiving groove 401. Thus, it is possible to prevent the color interference and Haze phenomenon between the neighboring pixel columns by the use of light absorbing layer 450.

Also, the bank 400 is provided with the first receiving groove 410 in the area between the neighboring pixels (P1, P3) included in the odd-numbered pixel column of the first column (C1), the third column (C3) and the fifth column (C5), and the light absorbing layer 450 is provided in the first receiving groove 401. Thus, it is possible to prevent the color interference and Haze phenomenon between the neighboring pixels (P1, P3) by the use of light absorbing layer 450.

However, the problems related with the color interference and Haze phenomenon are not generated in the area between the neighboring pixels (P2) included in the even-numbered pixel column of the second column (C2), the fourth column (C4) and the sixth column (C6), whereby the first receiving groove 401 and the light absorbing layer 450 are not formed therein.

Eventually, according to another embodiment of the present disclosure, the first receiving groove 401 and the light absorbing layer 450 are formed in the boundary line between the neighboring pixels (P1, P2, P3) which emit the different-colored light. Especially, the first receiving groove 401 and the light absorbing layer 450 are provided to include a first straight-line structure 401a and 450a extending in a first direction on the boundary line between the neighboring pixel columns, and a second straight-line structure 401b and 450b extending in a second direction on the boundary line between the pixels (P1, P3) which are included in the same column and are configured to emit the different-colored light. In this case, the second straight-line structure 401b and 450b is formed to connect the neighboring first straight-line structures 401a and 450a with each other.

FIGS. 8 and 9 show some embodiments of the various pixel structures according to the present disclosure, but not limited to the pixel structure of FIGS. 8 and 9. That is, it is possible to include the generally-known various pixel structures based on the technical idea of the present disclosure.

Figure 10:
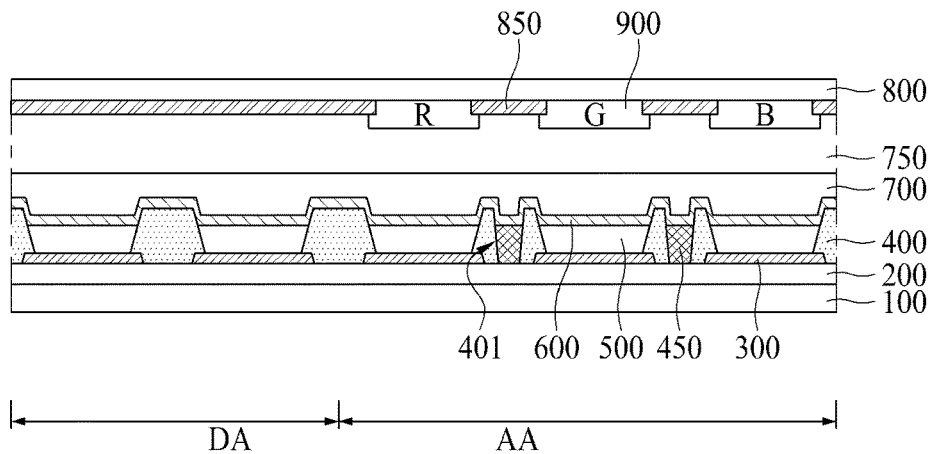
FIG. 10 is a cross sectional view illustrating an electroluminescent display device according to another embodiment of the present disclosure.

FIG. 10 is a cross sectional view illustrating an electroluminescent display device according to another embodiment of the present disclosure, which shows a dummy area (DA) and an active area (AA) of FIG. 2.

As shown in FIG. 10, a first substrate 100, a circuit device layer 200, a first electrode 300, a bank 400, a light absorbing layer 450, an emission layer 500, a second electrode 600, an encapsulation layer 700, an adhesive layer 750, a second substrate 800, a black matrix 850, and a color filter 900 are formed in the active area (AA).

The first substrate 100, the circuit device layer 200, the first electrode 300, the bank 400, the light absorbing layer 450, the emission layer 500, the second electrode 600, the encapsulation layer 700, the adhesive layer 750, the second substrate 800, the black matrix 850, and the color filter 900 formed in the active area (AA) are identical in structure to those of FIG. 3, however, they may be formed in the same structure as those of FIGS. 4 to 9. Especially, a gas absorbing layer 460 may be additionally formed above or below the light absorbing layer 450, as shown in FIGS. 5A and 5B.

In the dummy area (DA), there are a first substrate 100, a circuit device layer 200, a first electrode 300, a bank 400, an emission layer 500, a second electrode 600, an encapsulation layer 700, an adhesive layer 750, a second substrate 800, and a black matrix 850.

The circuit device layer 200 formed in the dummy area (DA) may be identical in structure to the circuit device layer 200 formed in the active area (AA), and the circuit device layer 200 formed in the dummy area (DA) and the circuit device layer 200 formed in the active area (AA) may be manufactured by the same process, but not necessarily. That is, some of signal lines such as a gate line, a data line, a power line and a reference line may be not included in the circuit device layer 200 formed in the dummy area (DA), or some of a switching thin film transistor and a driving thin film transistor may be not included in the circuit device layer 200 formed in the dummy area (DA), whereby a light emission may be not generated in the dummy area (DA). If needed, the circuit device layer 200 formed in the dummy area (DA) may be configured incompletely so as not to operate any one of the switching thin film transistor and the driving thin film transistor.

The first electrode 300 formed in the dummy area (DA) may be identical in structure to the first electrode 300 formed in the active area (AA), and the first electrode 300 formed in the dummy area (DA) and the circuit first electrode 300 formed in the active area (AA) may be manufactured by the same process. The first electrode 300 may be not formed in the dummy area (DA), whereby a light emission may be not generated in the dummy area (DA).

The bank 400 formed in the dummy area (DA) may be different in structure from the bank 400 formed in the active area (AA). That is, the first receiving groove 401 is provided in the bank 400 formed in the active area (AA), and the light absorbing layer 450 is provided in the first receiving groove 401. However, the first receiving groove 401 is not provided in the bank 400 formed in the dummy area (DA), whereby the light absorbing layer 450 is not provided in the dummy area (DA). An image is not displayed in the dummy area (DA), whereby the problems related with the color interference and Haze phenomenon are not generated between the neighboring pixels in the dummy area (DA).

The emission layer 500 formed in the dummy area (DA) may be identical in structure to the emission layer 500 formed in the active area (AA), and the emission layer 500 formed in the dummy area (DA) and the emission layer 500 formed in the active area (AA) may be manufactured by the same process. Unlike the emission layer 500 formed in the active area (AA), some organic layers may be removed from the emission layer 500 formed in the dummy area (DA), whereby a light emission may be not generated in the dummy area (DA).

The second electrode 600 formed in the dummy area (DA) may extend from the second electrode 600 formed in the active area (AA). The second electrode 600 may be not formed in the dummy area (DA), whereby a light emission may be not generated in the dummy area (DA).

Each of the encapsulation layer 700 and the adhesive layer 750 formed in the dummy area (DA) may extend from each of the encapsulation layer 700 and the adhesive layer 750 formed in the active area (AA).

An image is not displayed in the dummy area (DA), whereby the color filter 900 is not provided in the dummy area (DA). Instead, the black matrix 850 is formed inside the second substrate 800 of the dummy area (DA) so that it is possible to prevent light from being emitted to the dummy area (DA). As shown in the active area (AA) of FIG. 4, the black matrix 850 formed in the dummy area (DA) may be disposed between the encapsulation layer 700 and the adhesive layer 750.

Figure 11:
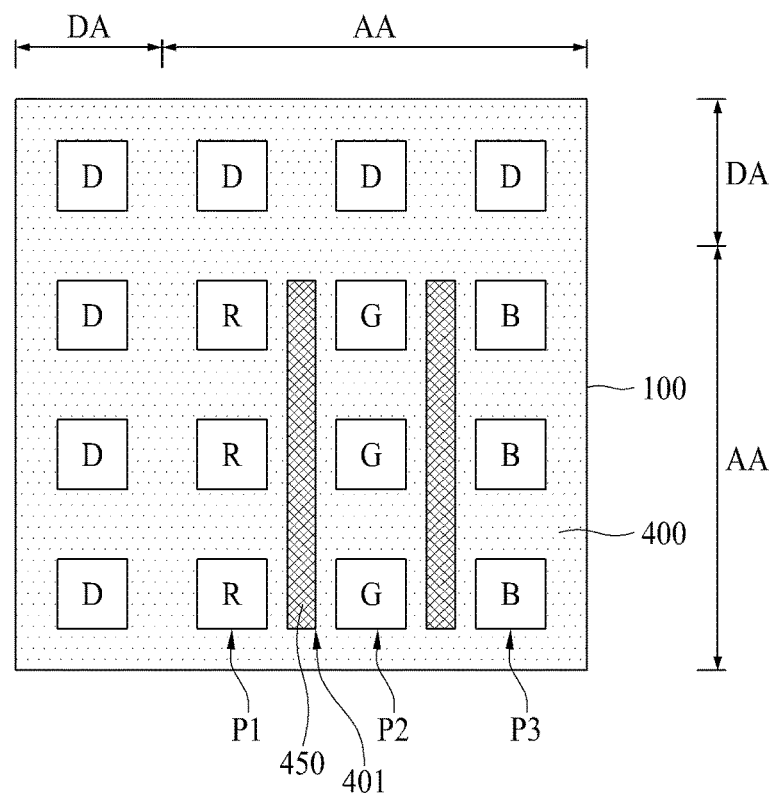
FIG. 11 is a plane view illustrating an electroluminescent display device according to another embodiment of the present disclosure.

FIG. 11 is a plane view illustrating an electroluminescent display device according to another embodiment of the present disclosure, which shows a plane structure of the electroluminescent display device shown in FIG. 10.

As shown in FIG. 11, an active area (AA) is provided on a first substrate 100, and a dummy area (DA) is provided in the periphery of the active area (AA).

A plurality of first pixels (P1) for emitting first-colored light of red (R) light, a plurality of second pixels (P2) for emitting second-colored light of green (G) light, and a plurality of third pixels (P3) for emitting third-colored light of blue (B) light may be provided in the active area (AA), and a bank 400 is formed in a matrix configuration along the boundary line between the plurality of pixels (P1, P2, P3).

The first pixels (P1), the second pixels (P2), and the third pixels (P3) are aligned in columns. For example, the plurality of first pixels (P1) are aligned in any one column, the plurality of second pixels (P2) are aligned in another column, and the plurality of third pixels (P3) are aligned in another column.

The bank 400 is provided with a first receiving groove 401 in the area between the neighboring pixel columns, and a light absorbing layer 450 is provided in the first receiving groove 401. Accordingly, it is possible to prevent the problems related with the color interference and Haze phenomenon between the neighboring pixel columns by the use of light absorbing layer 450.

A pixel structure inside the active area (AA), a structure of the bank 400 and the first receiving groove 401, and a structure of the light absorbing layer 450 are identical to those of FIG. 8, but not necessarily. The above structures may be identical to those of FIG. 9, or may be changed in various types.

The dummy area (DA) is provided with a plurality of dummy pixels (D) which do not emit light, and a bank 400 is formed in a matrix configuration along the boundary line between the plurality of dummy pixels (D). However, the first receiving groove 401 is not formed in the bank 400 provided in the dummy area (DA), whereby the light absorbing layer 450 is not formed in the dummy area (DA).

Figure 12:
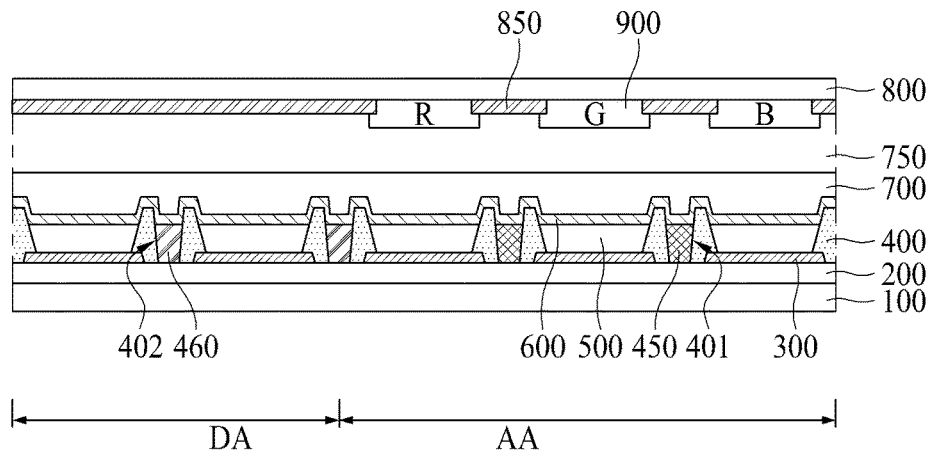
FIG. 12 is a cross sectional view illustrating an electroluminescent display device according to another embodiment of the present disclosure.

FIG. 12 is a cross sectional view illustrating an electroluminescent display device according to another embodiment of the present disclosure. Except a structure of a bank 400 in a dummy area (DA) and a gas absorbing layer 460 additionally provided in the dummy area (DA), the electroluminescent display device of FIG. 12 is identical in structure to the electroluminescent display device of FIG. 10, whereby the same reference numbers will be used throughout the drawings to refer to the same parts, and a detailed description for the same parts will be omitted.

As shown in FIG. 12, a second receiving groove 402 is provided in a bank 400 of a dummy area (DA), and a gas absorbing layer 460 is provided in the second receiving groove 402.

As described above in FIG. 5B, the gas generated in the planarization layer 270 may be discharged to the end of the first substrate 100 through the inside of the planarization layer 270, that is, may be discharged to the end of the dummy area (DA). Then, the gas discharged to the end of the dummy area (DA) may be moved to the upper side of the emission layer 500 and the bank 400.

In the embodiment of FIG. 12, the gas absorbing layer 460 is provided in the dummy area (DA) so as to absorb the gas which is moved to the upper side of the bank 400 and the emission layer 500 in the dummy area (DA). Especially, the second receiving groove 402 is formed in the bank 400 provided in the dummy area (DA), and the gas absorbing layer 460 is formed in the second receiving groove 402.

In the same manner as the aforementioned first receiving groove 401, the second receiving groove 402 may penetrate through the bank 400 provided in the dummy area (DA). However, the second receiving groove 402 may not penetrate through the bank 400 provided in the dummy area (DA).

Figure 13:
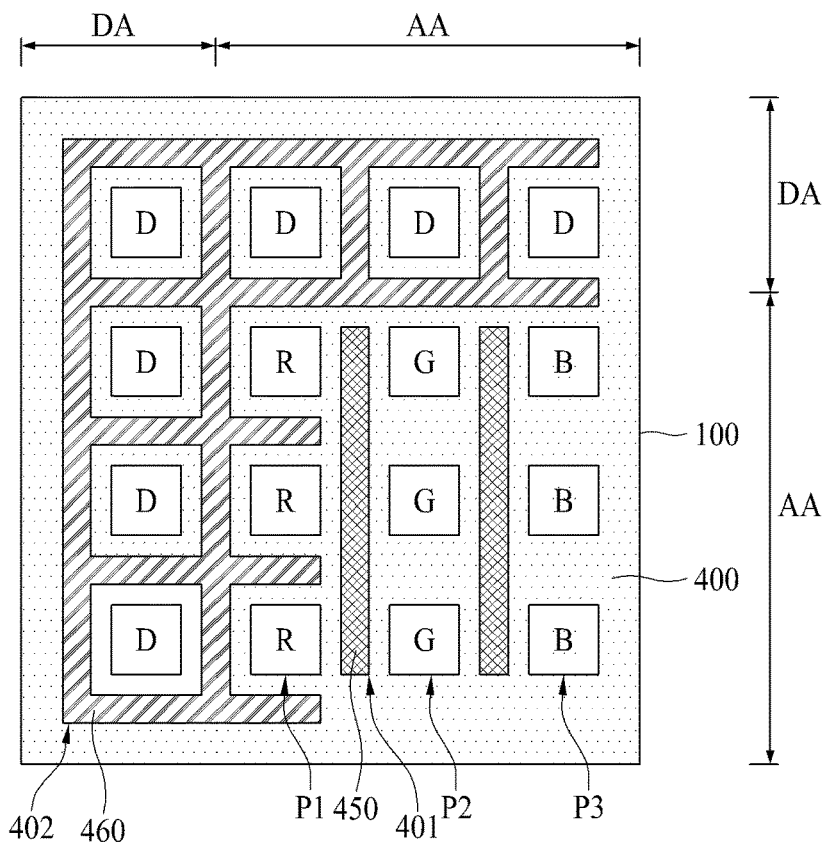
FIG. 13 is a plane view illustrating an electroluminescent display device according to another embodiment of the present disclosure.

FIG. 13 is a plane view illustrating an electroluminescent display device according to another embodiment of the present disclosure, which shows a plane structure of the electroluminescent display device of FIG. 12.

As shown in FIG. 13, an active area (AA) is provided on a first substrate 100, and a dummy area (DA) is provided in the periphery of the active area (AA).

A structure of the active area (AA) is the same as the structure of the active area (AA) shown in FIG. 11, whereby a detailed description for the active area (AA) will be omitted.

The dummy area (DA) is provided with a plurality of dummy pixels (D) which do not emit light, and a bank 400 is formed in a matrix configuration along the boundary line between the plurality of dummy pixels (D).

The bank 400 formed in the dummy area (DA) is provided with a second receiving groove 402 in the boundary line between the neighboring dummy pixels (D), and a gas absorbing layer 460 is provided in the second receiving groove 402. The second receiving groove 402 and the gas absorbing layer 460 may be formed in a matrix configuration along the boundary line between the plurality of dummy pixels (D) on the entire dummy area (DA), but not necessarily. In order to improve an absorbing rate of gas generated in a planarization layer 270, the second receiving groove 402 and the gas absorbing layer 460 are formed in the matrix configuration along the entire boundary lines between the plurality of dummy pixels (D), preferably.

Figure 14:
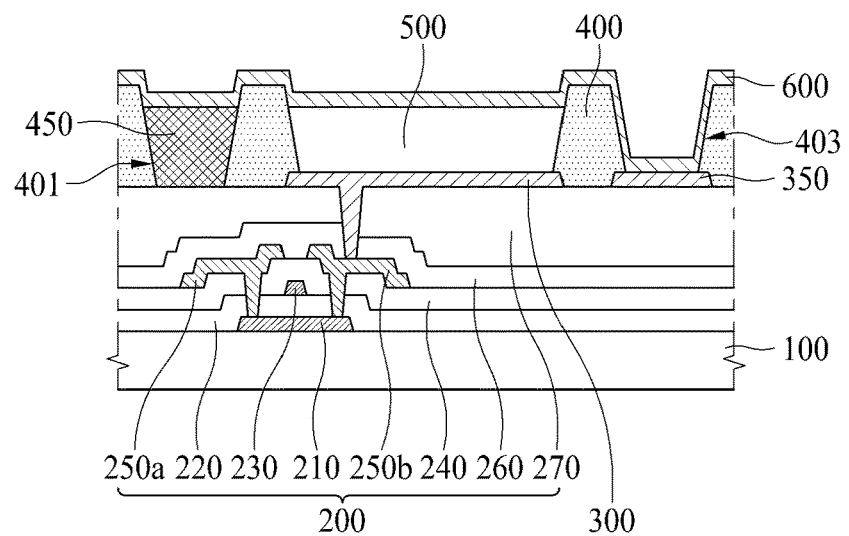
FIG. 14 is a cross sectional view illustrating an electroluminescent display device according to another embodiment of the present disclosure.

FIG. 14 is a cross sectional view illustrating an electroluminescent display device according to another embodiment of the present disclosure. The electroluminescent display device of FIG. 14 is different in structure from the electroluminescent display device of FIG. 3 as the electroluminescent display device of FIG. 14 is provided with an additional auxiliary electrode 350. Hereinafter, the same reference numbers will be used throughout the drawings to refer to the same parts, and only the different structures will be described in detail as follows.

As shown in FIG. 14, according to another embodiment of the present disclosure, an auxiliary electrode 350 is formed on a planarization layer 270 of a circuit device layer 200.

The auxiliary electrode 350 is provided at a predetermined interval from a first electrode 300. The auxiliary electrode 350 and the first electrode 300 may be formed of the same material, and may be manufactured by the same process.

The auxiliary electrode 350 is provided to lower a resistance of a second electrode 600. In case of a top emission type electroluminescent display device, the second electrode 600 may be formed of a transparent conductive material. However, the transparent conductive material is disadvantageous in that it has a large resistance. Thus, the second electrode 600 of the transparent conductive material is connected with the auxiliary electrode 350, and the auxiliary electrode 350 is formed of a material having good conductivity, to thereby lower the resistance of the second electrode 600.

In order to connect the auxiliary electrode 350 with the second electrode 600, a contact hole 403 is provided in the bank 400. Thus, the auxiliary electrode 350 is exposed via the contact hole 403. In this case, the bank 400 may be provided to cover both ends of the auxiliary electrode 350. As described above in FIG. 7, if the bank 400 includes a first bank 410 and a second bank 420, the contact hole 403 is provided in each of the first bank 410 and the second bank 420, and the auxiliary electrode 350 is exposed via the contact hole 403. Accordingly, the second electrode 600 is connected with the auxiliary electrode 350 via the contact hole 403 prepared in the bank 400.

Meanwhile, although not shown, the auxiliary electrode 350 may be applied to the various embodiments of the electroluminescent display device.

Figure 15:
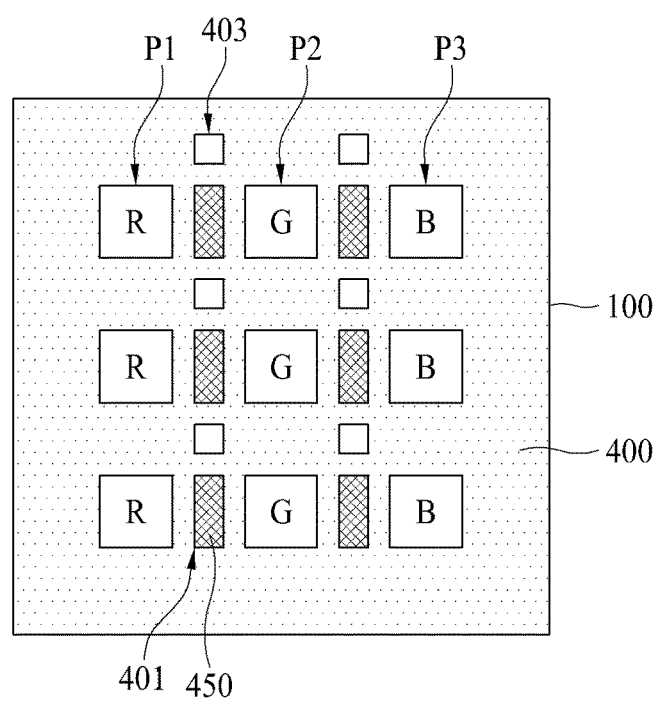
FIG. 15 is a plane view illustrating an electroluminescent display device according to another embodiment of the present disclosure.

FIG. 15 is a plane view illustrating an electroluminescent display device according to another embodiment of the present disclosure, which shows a plane structure of the electroluminescent display device shown in FIG. 14.

As shown in FIG. 15, a plurality of first pixels (P1), a plurality of second pixels (P2), and a plurality of third pixels (P3) are provided on a first substrate 100, and a bank 400 is provided in a matrix configuration along the boundary line between the plurality of pixels (P1, P2, P3).

A first receiving groove 401 and a contact hole 403 are provided in the bank 400.

According as the first receiving groove 401 and the contact hole 403 are not overlapped with each other, it is possible to prevent a light absorbing layer 450 provided in the first receiving groove 401 from being formed in the contact hole 403. If the light absorbing layer 450 is formed in the contact hole 403, it may cause a problem related with an electrical connection between the auxiliary electrode 350 and a second electrode 600.

The first receiving groove 401 and the contact hole 403 are provided in the boundary line between the neighboring pixel columns (C1, C2, C3). Especially, the first receiving groove 401 confronts with the pixels (P1, P2, P3) in the boundary lines between the pixels (P1, P2, P3) neighboring along a horizontal direction, and the contact hole 403 is provided in the boundary line between the pixels (P1, P2, P3) facing in a diagonal direction.

The first receiving groove 401 and the contact hole 403 are provided on a straight line in the boundary line between the neighboring pixel columns (C1, C2, C3). The first receiving groove 401 is formed in a discontinuous straight-line structure. Accordingly, the plurality of first receiving grooves 401 and the plurality of contact holes 403 are alternately provided in the boundary line between the neighboring pixel columns (C1, C2, C3). That is, the first receiving groove 401 is provided with a plurality of straight-line structures provided at fixed intervals, and the contact hole 403 is positioned between each of the plurality of straight-line structures 401 provided at fixed intervals.

Accordingly, the light absorbing layer 450 formed in the first receiving groove 401 is provided with a plurality of straight-line structures provided at fixed intervals, and the contact hole 403 is positioned between each of the plurality of straight-line structures 450 provided at fixed intervals.

Figure 16:
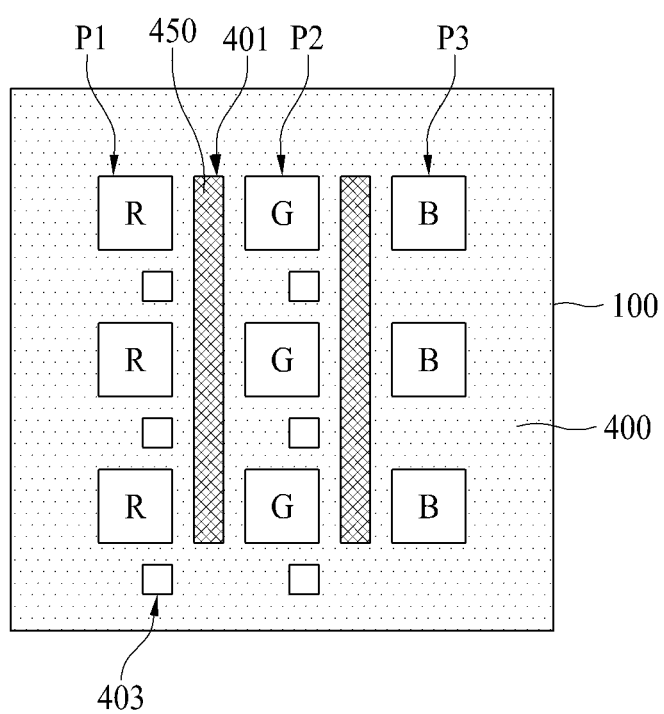
FIG. 16 is a plane view illustrating an electroluminescent display device according to another embodiment of the present disclosure.

FIG. 16 is a plane view illustrating an electroluminescent display device according to another embodiment of the present disclosure. Except a position of a contact hole 403, and a structure of a first receiving groove 401 and a light absorbing layer 450, the electroluminescent display device of FIG. 16 is identical in structure to the electroluminescent display device of FIG. 15. Hereinafter, only the different structures will be described in detail as follows.

As shown in FIG. 16, a first receiving groove 401 and a light absorbing layer 450 are provided in a continuous straight-line structure along the boundary line between the neighboring pixel columns (C1, C2, C3).

A contact hole 403 is positioned out of the continuous straight-line structure while being not overlapped with the first receiving groove 401 and the light absorbing layer 405 formed in the continuous straight-line structure. Especially, the contact hole 403 may be positioned out of the boundary line between the neighboring pixel columns (C1, C2, C3).

According to the present disclosure, the first receiving groove is formed in the bank, and the light absorbing layer is formed in the first receiving groove so that the external light is absorbed in the light absorbing layer, to thereby prevent the color interference and Haze phenomenon between the neighboring pixels.

It will be apparent to those skilled in the art that the present disclosure described above is not limited by the above-described embodiments and the accompanying drawings and that various substitutions, modifications, and variations can be made in the present disclosure without departing from the scope of the disclosures. Consequently, the scope of the present invention is defined by the accompanying claims. It is intended that all variations or modifications derived from the meaning, scope, and equivalent concept of the disclosure fall within the scope of the accompanying claims.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification, but should be construed to include the full scope to which such claims are entitled. The following list provides aspects of the disclosure and forms part of the description. These aspects can be combined in any compatible combination beyond those expressly stated. The aspects can also be combined with any compatible features described herein.

Aspect 1. An electroluminescent display device comprising: a substrate; a first electrode provided on the substrate; a bank configured to cover an end of the first electrode and to define an emission area, and provided with a first receiving groove; an emission layer provided on the first electrode in the emission area defined by the bank; a light absorbing layer provided in the first receiving groove of the bank; and a second electrode provided on the emission layer.

Aspect 2. The electroluminescent display device according to aspect 1, further comprising a color filter confronting the emission layer.

Aspect 3. The electroluminescent display device according to aspect 1, wherein a gas absorbing layer is additionally provided in the first receiving groove of the bank, and the gas absorbing layer is provided in at least one of lower and upper surfaces of the light absorbing layer.

Aspect 4. The electroluminescent display device according to aspect 1, wherein the first receiving groove is provided from an upper end of the bank to a lower end of the bank so as to penetrate through the bank so that a lower surface of the light absorbing layer is in contact with a planarization layer provided below the bank.

Aspect 5. The electroluminescent display device according to aspect 1, wherein some area of the bank has a first height, and the first receiving groove has a first depth which is lower than the first height.

Aspect 6. The electroluminescent display device according to aspect 5, wherein the remaining area of the bank which is provided with the first receiving groove has a second height which is lower than the first height, and a lower surface of the light absorbing layer is in contact with the remaining area of the bank.

Aspect 7. The electroluminescent display device according to aspect 1, wherein a height of an upper end of the emission layer in the center of the emission area is lower than a height of an upper end of the emission layer in the end of the emission area, and wherein the bank includes a first bank, and a second bank provided on the first bank, wherein the second bank has a relatively smaller width in comparison to the first bank, and has a relatively larger thickness in comparison to the first bank.

Aspect 8. The electroluminescent display device according to aspect 1, further comprising an auxiliary electrode which is electrically connected with the second electrode and also provided below the bank, wherein the bank includes a contact hole for exposing the auxiliary electrode, and the second electrode is connected with the auxiliary electrode via the contact hole, and the first receiving groove and the contact hole are not overlapped with each other.

Aspect 9. An electroluminescent display device comprising: a substrate including an active area, and a dummy area prepared in the periphery of the active area; a bank disposed on the active area and the dummy area of the substrate, configured to define an emission area, and provided with a first receiving groove; an emission layer provided in the emission area defined by the bank; and a light absorbing layer provided in the first receiving groove of the bank, wherein a pattern of the bank provided in the active area is different from a pattern of the bank provided in the dummy area.

Aspect 10. The electroluminescent display device according to aspect 9, wherein the first receiving groove is provided in the active area, and is not provided in the dummy area.

Aspect 11. The electroluminescent display device according to aspect 9, wherein a second receiving groove is provided in the bank formed in the dummy area, and a gas absorbing layer is provided in the second receiving groove.

Aspect 12. The electroluminescent display device according to aspect 9, further comprising a color filter confronting the emission layer of the active area.

Aspect 13. The electroluminescent display device according to aspect 9, wherein a gas absorbing layer is additionally provided in the first receiving groove of the bank, and the gas absorbing layer is provided in at least one of upper and lower surfaces of the light absorbing layer.

Aspect 14. The electroluminescent display device according to aspect 9, further comprising: a second electrode provided on the emission layer; and an auxiliary electrode electrically connected with the second electrode and provided below the bank, wherein the bank includes a contact hole for exposing the auxiliary electrode, and the second electrode is connected with the auxiliary electrode via the contact hole, and the first receiving groove and the contact hole are not overlapped with each other.

Aspect 15. An electroluminescent display device comprising: a substrate including an active area, and a dummy area prepared in the periphery of the active area; a plurality of pixels provided in the active area; a plurality of dummy pixels provided in the dummy area; and a bank prepared in the boundary line between each of the plurality of pixels, and between each of the plurality of dummy pixels, wherein the bank includes a first receiving groove provided in the boundary line of the pixels which emit the different-colored light among the plurality of pixels, and a light absorbing layer is provided in the first receiving groove.

Aspect 16. The electroluminescent display device according to aspect 15, wherein the first receiving groove is not provided in the boundary line between the pixels which emit the same-colored light among the plurality of pixels.

Aspect 17. The electroluminescent display device according to aspect 15, wherein the plurality of pixels include a plurality of first pixels for emitting the first-colored light, and a plurality of second pixels for emitting the second-colored light, wherein the first receiving groove and the light absorbing layer are provided to include a first continuous straight-line structure extending in a first direction along the boundary line between the plurality of first pixels and between the plurality of second pixels.

Aspect 18. The electroluminescent display device according to aspect 17, wherein the plurality of pixels include a plurality of third pixels for emitting the third-colored light, the first receiving groove and the light absorbing layer are provided to include a second continuous straight-line structure extending in a second direction along the boundary line between the plurality of first pixels and between the plurality of third pixels, and the second straight-line structure is connected with the first straight-line structure.

Aspect 19. The electroluminescent display device according to aspect 15, wherein the bank includes a second receiving groove provided in the boundary line between the plurality of dummy pixels, and a gas absorbing layer is provided in the second receiving groove.

Aspect 20. The electroluminescent display device according to aspect 15, wherein the bank includes a contact hole additionally provided in an area which is not overlapped with the first receiving groove, the first receiving groove is provided with a plurality of straight-line structures provided at fixed intervals in the boundary line between each of the plurality of pixels, and the contact hole is formed between each of the plurality of straight-line structures.

Aspect 21. The electroluminescent display device according to aspect 15, wherein the bank includes a contact hole additionally provided in an area which is not overlapped with the first receiving groove, the first receiving groove is formed in a continuous straight-line structure in the boundary line between each of the plurality of pixels, and the contact hole is positioned out of the continuous straight-line structure.

It will be apparent to those skilled in the art that various modifications and variations can be made in the electroluminescent display device of the present disclosure without departing from the technical idea or scope of the disclosure. Thus, it is intended that the present disclosure cover the modifications and variations of this disclosure provided they come within the scope of the appended claims and their equivalents.

The invention claimed is:

1. An electroluminescence display device, comprising:
a substrate;
a first electrode provided on the substrate;
a bank configured to cover an end of the first electrode and to define an emission area;
an emission layer provided on the first electrode in the emission area defined by the bank; and
a second electrode provided on the emission layer,
wherein the bank is configured to absorb a light,
wherein the bank is provided with a first receiving groove, and there is a light absorbing layer provided in the first receiving groove of the bank, and
wherein the electroluminescent display device further comprises a color filter over the emission area, and wherein the light-absorbing layer is provided so as to not overlap the color filter.

2. The electroluminescent display device of claim 1, wherein the emission area has a height at a center of the emission area that is lower than a height at an edge of the emission area.

3. The electroluminescent display device according to claim 1, wherein a gas absorbing layer is provided in the first receiving groove of the bank, and the gas absorbing layer is provided in contact with at least one of lower and upper surfaces of the light absorbing layer.

4. The electroluminescent display device according to claim 1, wherein the first receiving groove is provided to penetrate through the bank so that a lower surface of the light absorbing layer is in contact with a planarization layer provided below the bank.

5. The electroluminescent display device according claim 1, wherein a thickness of the light absorbing layer at a center is smaller than a thickness of the light absorbing layer at an edge.

6. The electroluminescent display device according to claim 1, wherein a portion of the bank has a first height, and the first receiving groove has a first depth which is less than the first height.

7. The electroluminescent display device according to claim 6, wherein the remaining portion of the area of the bank has a second height which is lower than the first height, and a lower surface of the light absorbing layer is in contact with the remaining portion of the area of the bank.

8. The electroluminescent display device according to claim 1,
wherein a height of the emission layer in a center of the emission area is lower than a height of the emission layer at an edge of the emission area, and
wherein the bank includes a first bank, and a second bank provided on the first bank, wherein the second bank has a width smaller than a width of the first bank, and has a thickness larger than a thickness of the first bank.

9. The electroluminescent display device according to claim 8, wherein the second electrode is provided on the emission layer, the second bank and the light-absorbing layer.

10. The electroluminescent display device according to claim 8, wherein the second bank is formed as a linear structure in an active area.

11. The electroluminescent display device according to claim 1, further comprising an auxiliary electrode which is electrically connected with the second electrode,
wherein the bank includes a contact hole for exposing the auxiliary electrode, and the second electrode is connected with the auxiliary electrode via the contact hole.

12. An electroluminescent display device, comprising:
a substrate including an active area, and a dummy area provided at a periphery of the active area;
a plurality of pixels provided in the active area;
a plurality of dummy pixels provided in the dummy area; and
a bank provided at a boundary between each of the plurality of pixels, and between each of the plurality of dummy pixels,
wherein the bank is configured to absorb a light at the boundary between pixels which are configured to emit a different-colored light among the plurality of pixels,
wherein the bank is provided with a first receiving groove at the boundary between the pixels which are configured to emit the different-colored light among the plurality of pixels; and
there is a light absorbing layer provided in the first receiving groove of the bank, and
wherein the first receiving groove is not provided at the boundary between pixels which are configured to emit a same-colored light among the plurality of pixels.

13. The electroluminescent display device according to claim 12, wherein the bank is disposed on the active area and disposed on the dummy area of the substrate, and the bank is configured to define an emission area;
wherein a pattern of the bank disposed on the active area is different from a pattern of the bank disposed on the dummy area; and
wherein the electroluminescent display device further comprises an emission layer provided in the emission area defined by the bank.

14. The electroluminescent display device according to claim 13, further comprising a color filter over the emission layer of the emission area.

15. The electroluminescent display device according to claim 12, wherein the first receiving groove is provided in the active area, and is not provided in the dummy area.

16. The electroluminescent display device according to claim 12, wherein a gas absorbing layer is provided in the first receiving groove of the bank, and the gas absorbing layer is provided in contact with at least one of upper and lower surfaces of the light absorbing layer.

17. The electroluminescent display device according to claim 12, further comprising:
an electrode provided on the emission layer; and
an auxiliary electrode electrically connected with the electrode and provided below the bank,
wherein the bank includes a contact hole for exposing the auxiliary electrode, and the electrode is connected with the auxiliary electrode via the contact hole, and
the first receiving groove and the contact hole do not overlap.

18. The electroluminescent display device according to claim 12, wherein the first receiving groove is provided with a plurality of straight-line structures provided at fixed intervals along the boundaries between groups of pixels from the plurality of pixels, and the contact hole is formed between two of the plurality of straight-line structures.

19. The electroluminescent display device according to claim 12, wherein the first receiving groove is formed in a continuous straight-line structure at the boundary between each of the plurality of pixels.

20. The electroluminescent display device according to claim 12, wherein a second receiving groove is provided in the bank formed in the dummy area, and
a gas absorbing layer is provided in the second receiving groove.

21. The electroluminescent display device according to claim 20, wherein the second receiving groove is provided at the boundaries between the pixels of the plurality of dummy pixels.

22. The electroluminescent display device according to claim 12, wherein the plurality of pixels includes a plurality of first pixels for emitting a first-colored light, and a plurality of second pixels for emitting a second-colored light,
wherein the first receiving groove and the light absorbing layer are provided to include a first continuous straight-line structure extending in a first direction along a first boundary between the plurality of first pixels and between the plurality of second pixels.

23. The electroluminescent display device according to claim 22, wherein the plurality of pixels includes a plurality of third pixels for emitting a third-colored light,
the first receiving groove and the light absorbing layer are provided to include a second continuous straight-line structure extending in a second direction along a second boundary between the plurality of first pixels and between the plurality of third pixels, and
the second continuous straight-line structure is connected with the first continuous straight-line structure.

24. The electroluminescent display device according to claim 23, further comprising:
contact holes, for connecting to auxillary electrodes provided below the bank, are formed between the first continous straight-line structure and the second continuous straight-line structure.

25. An electroluminescent display device, comprising:
a substrate including an active area;
a plurality of first electrodes provided on the substrate; a first bank configured to cover two or more of the plurality of first electrodes;
a second bank disposed on the first bank;
wherein the first bank and the second bank are configured to define a plurality of emission areas;
wherein each emissions area has an emission layer provided on a corresponding first electrode among the plurality of first electrodes;
wherein the second bank has a linear structure in the active area,
wherein the first bank and the second bank are provided with a first receiving groove, and there is a light absorbing layer provided in the first receiving groove of the first bank and the second bank, wherein the light absorbing layer is in direct and physical contact with the first bank and the second bank, and wherein a material of the first bank is different from that of the second bank.

26. The electroluminescent display device according to claim 25, wherein for each emission layer in the plurality of emissions areas, the emission layer has a height at a center of each emission area lower than a height at an edge of each emission layer.

27. The electroluminescent display device according to claim 25, wherein for each emission layer in the plurality of emissions areas there is an associated color filter over the emission layer.

28. The electroluminescent display device according to claim 25, further comprising a dummy area provided at a periphery of the active area;

wherein a pattern of the second bank provided in the active area is different from a pattern of the second bank provided in the dummy area.

29. The electroluminescent display device according to claim 25, wherein a thickness of the second bank is thicker than a thickness of the first bank.

30. The electroluminescent display device according to claim 25, wherein, in the active area, the second bank extends in a direction that is perpendicular to a direction in which the first bank extends.

31. The electroluminescent display device according to claim 25, wherein the emission layer is aligned in a direction along the second bank have a same thickness in the center of each emission area.

32. The electroluminescent display device according to claim 25, wherein:

each emission area has a corresponding second electrode provided on the emission layer, and an associated contact hole in the first bank; and wherein the second bank and the associated contact hole do not overlap.

33. The electroluminescent display device according to claim 25, wherein the second bank is configured to absorb light.

34. The electroluminescent display device according to claim 25, wherein the material of the second bank is an organic insulating material.

* * * * *